(12) United States Patent
Biswas et al.

(10) Patent No.: US 11,551,745 B2
(45) Date of Patent: Jan. 10, 2023

(54) COMPUTATION IN-MEMORY ARCHITECTURE FOR ANALOG-TO-DIGITAL CONVERSION

(71) Applicant: TEXAS INSTRUMENTS INCORPORATED, Dallas, TX (US)

(72) Inventors: Avishek Biswas, Dallas, TX (US); Mahesh Madhukar Mehendale, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/162,842

(22) Filed: Jan. 29, 2021

(65) Prior Publication Data

US 2021/0241820 A1 Aug. 5, 2021

Related U.S. Application Data

(60) Provisional application No. 62/967,653, filed on Jan. 30, 2020.

(51) Int. Cl.
*G11C 5/06* (2006.01)
*G11C 11/4094* (2006.01)
(Continued)

(52) U.S. Cl.
CPC ............ *G11C 11/4094* (2013.01); *G06F 7/52* (2013.01); *G06N 3/0454* (2013.01);
(Continued)

(58) Field of Classification Search
CPC .......... G06F 7/52; G06N 3/04; G06N 3/0454; G06N 3/0635; G11C 11/4094;
(Continued)

(56) References Cited

U.S. PATENT DOCUMENTS

2004/0075601 A1\* 4/2004 Garreau .............. H03M 1/1245
341/172
2012/0139771 A1\* 6/2012 Le Tual ................ H03M 1/468
341/155
(Continued)

OTHER PUBLICATIONS

Biswas et al., "Conv-RAM: An Energy-Efficient SRAM with Embedded Convolution Computation for Low-Power CNN-Based Machine Learning Applications," ISSCC 2018 / Session 31 / Computation In Memory For Machine Learning / 31.1, Feb. 14, 2018, 3 p.
(Continued)

*Primary Examiner* — Mushfique Siddique
(74) *Attorney, Agent, or Firm* — Ming Wai Choy; Frank D. Cimino

(57) ABSTRACT

A device includes a comparator to provide an indication of a difference between Vp on a first terminal coupled to a top plate of each of a first group of differential capacitors, and Vn on a second terminal coupled to a top plate of each of a second group of differential capacitors. The device includes a control circuit coupled to the comparator. The control circuit is to receive a first indication of a difference between Vp and Vn; responsive to the first indication, cause a first driver to provide a reference voltage to bottom plates of one of the first and second groups, and cause a second driver to provide a ground voltage to bottom plates of the other of the first and second groups; receive a second indication of a difference between Vp and Vn; and provide a digital value responsive to the first indication and the second indication.

24 Claims, 9 Drawing Sheets

(51) Int. Cl.
  *G11C 11/4097* (2006.01)
  *G11C 11/4074* (2006.01)
  *G11C 11/4099* (2006.01)
  *G06F 7/52* (2006.01)
  *G11C 11/54* (2006.01)
  *G11C 7/10* (2006.01)
  *G06N 3/063* (2006.01)
  *G06N 3/04* (2006.01)
  *G11C 7/16* (2006.01)
  *G11C 11/412* (2006.01)

(52) U.S. Cl.
  CPC ............. *G06N 3/0635* (2013.01); *G11C 5/06* (2013.01); *G11C 7/1006* (2013.01); *G11C 7/16* (2013.01); *G11C 11/4074* (2013.01); *G11C 11/4097* (2013.01); *G11C 11/4099* (2013.01); *G11C 11/54* (2013.01); *G11C 11/412* (2013.01)

(58) Field of Classification Search
  CPC ... G11C 11/4074; G11C 11/4097; G11C 7/16; G11C 11/419; G11C 11/54
  See application file for complete search history.

(56) References Cited

U.S. PATENT DOCUMENTS

| | | | | |
|---|---|---|---|---|
| 2012/0280841 | A1* | 11/2012 | Wang | H03M 1/1295 |
| | | | | 341/172 |
| 2014/0085118 | A1* | 3/2014 | Tsai | H03M 1/462 |
| | | | | 341/122 |
| 2016/0134300 | A1* | 5/2016 | Wang | H03M 3/37 |
| | | | | 341/172 |
| 2018/0152196 | A1* | 5/2018 | Wen | H03M 1/462 |
| 2018/0183457 | A1* | 6/2018 | Lee | H03M 1/08 |
| 2021/0240441 | A1* | 8/2021 | Biswas | G11C 11/4074 |

OTHER PUBLICATIONS

Biswas et al., "CONV-SRAM: An Energy-Efficient SRAM With In-Memory Dot-Product Computation For Low-Power Convolutional Neural Networks," IEEE Journal of Solid-State Circuits, vol. 54, No. 1, Jan. 2019, pp. 217-230.

* cited by examiner

COMPUTATION IN-MEMORY ARCHITECTURE FOR ANALOG-TO-DIGITAL CONVERSION

CROSS-REFERENCE TO RELATED APPLICATIONS

This application claims priority to U.S. Provisional Patent Application No. 62/967,653 filed Jan. 30, 2020, which is hereby incorporated herein by reference in its entirety.

BACKGROUND

Convolutional neural networks (CNN) are a type of neural network designed for processing image data. The presence of a convolutional layer makes this type of neural network a CNN. In essence, a "convolution" is a linear operation that involves multiplication (dot product) of a set of weights with an input. In some cases, a CNN includes multiple layers, and each layer applies multiple filter weights to an input (e.g., performs a dot product) in order to produce an output. In some cases, a memory stores the filter weights and a processor (e.g., a central processing unit (CPU)) performs the dot product operation.

SUMMARY

In an example of the disclosure, a device includes a comparator configured to provide an indication of a difference between a positive differential voltage (Vp) on a first terminal coupled to a top plate of each of a first group of differential capacitors, and a negative differential voltage (Vn) on a second terminal coupled to a top plate of each of a second group of differential capacitors. The device also includes a control circuit coupled to the comparator. The control circuit is configured to receive a first indication of a difference between Vp and Vn; responsive to the first indication, cause a first driver to provide a reference voltage to bottom plates of one of the first group and the second group, and cause a second driver to provide a ground voltage to bottom plates of the other of the first group and the second group; receive a second indication of a difference between Vp and Vn; and provide a digital value responsive to the first indication and the second indication.

In another example of the disclosure, a method includes connecting top plates of a plurality of positive differential capacitors to provide a positive differential voltage (Vp). The plurality of positive differential capacitors includes a first group. The method also includes connecting top plates of a plurality of negative differential capacitors to provide a negative differential voltage (Vn). The plurality of negative differential capacitors includes a second group. The method also includes determining a first difference between Vp and Vn; responsive to the first difference, providing a reference voltage to bottom plates of one of the first group and the second group, and providing a ground voltage to the bottom plates of the other of the first group and the second group; responsive to providing the reference voltage and the ground voltage, determining a second difference between Vp and Vn; and providing a digital value responsive to the first difference and the second difference.

In yet another example of the disclosure, a device includes a first group of differential capacitors and a second group of differential capacitors. Each of the first group of differential capacitors is coupled to a different bit cell in a row of a compute-in-memory (CIM) array, and each of the second group of differential capacitors is coupled to one of the bit cells. The device also includes a comparator having a comparator output, a comparator non-inverting input, and a comparator inverting input. The comparator non-inverting input is coupled to a top plate of each of the first group and the comparator inverting input is coupled to a top plate of each of the second group. The device also includes a first driver having a first driver output and a first driver input, and a second driver having a second driver output and a second driver input. The first driver output is coupled to bottom plates of the first group, and the second driver output is coupled to bottom plates of the second group. The device also includes a control circuit coupled to the comparator output, the first driver input, and the second driver input, the control circuit configured to provide output signals to the first and second drivers responsive to the comparator output, and provide a digital output responsive to the comparator output and the output signals.

BRIEF DESCRIPTION OF THE DRAWINGS

The same reference numbers are used in the drawings to designate the same (or similar) features.

DETAILED DESCRIPTION

In some cases, a memory stores the filter weights and a processor (e.g., a central processing unit (CPU)) performs a dot product operation. In these cases, the memory access and data movement between the memory and CPU consumes a relatively large amount of power. For example, the amount of power consumed by the CPU performing the dot product operation is less than the amount of power consumed by memory access and data movement between the memory and CPU.

In some example embodiments, a computation, such as a dot product operation, is performed in an in-memory implementation. For example, a compute-in-memory (CIM) memory array (a "CIM array") stores filter weights of a convolutional neural network (CNN) layer. Input data is provided to the CIM array, and the CIM array performs the computation, such as a dot product operation, using the stored filter weights and the input data. The CIM array provides output data responsive to the computation. This reduces the power consumption to perform such a computation relative to a processor (e.g., separate from the memory storing filter weights) performing the computation.

In examples of this description, the CIM array is a static random-access memory (SRAM) array and the computation performed by the CIM array is a dot product operation. Examples of this description include a CIM array that is implemented using standard, 6-transistor (6T) bit cells, which allows the CIM array to be fabricated according to "special" foundry rules that are applicable to certain 6T designs and that enable a lower-area design relative to "regular" foundry rules.

Figure 1:
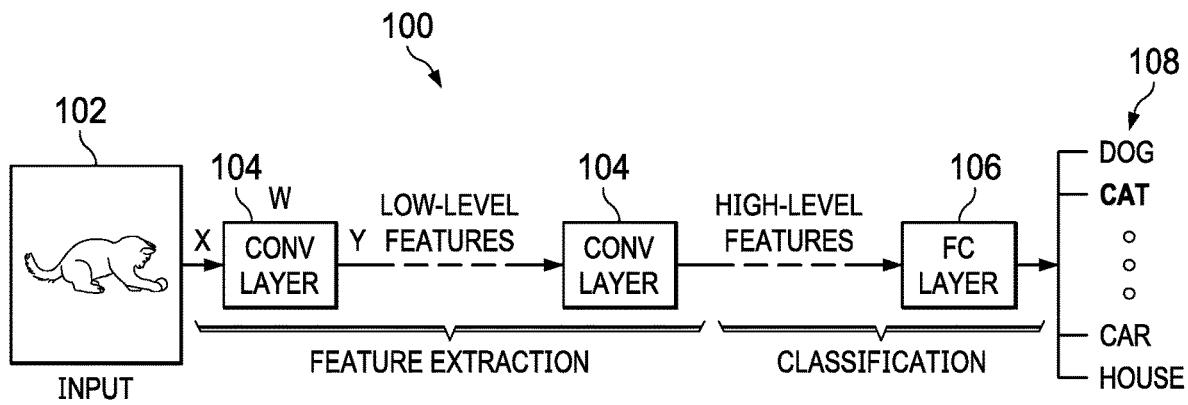
FIG. 1 is a block diagram of a convolutional neural network (CNN) in various examples.

FIG. 1 is a block diagram of an example convolutional neural network (CNN) 100 computation in various examples of this description. In this example, the CNN 100 receives an input image 102 in order to classify the input image 102. The input image 102 is provided to a first of one or more convolutional layers 104. Each convolutional layer 104 includes multiple (digital) filters that are applied to data provided to that convolutional layer 104, and each filter includes multiple filter weights. For example, a convolutional layer 104 applies filter weights W to input data X to generate or provide output data Y. In some cases, the application of convolutional layers 104 to the input image 102 is useful to extract various features from the input image 102. In the example of FIG. 1, the CNN 100 includes a final classification layer 106 that functions similarly to the convolutional layers 104. However, an output of the final classification layer 106 is a classification 108 of the input image 102. In this description, convolutional layers 104 and classification layers 106 are generally referred to as "layers."

Figure 2:
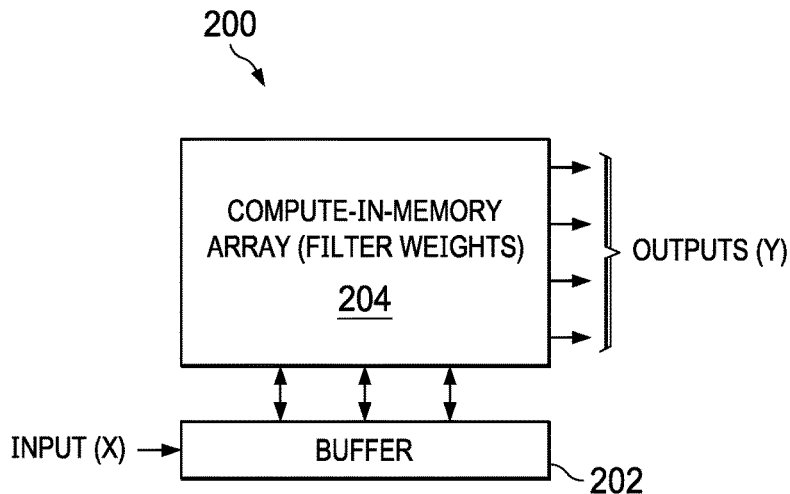
FIG. 2 is a block diagram of a memory circuit configured as a compute-in-memory (CIM) array in various examples.

FIG. 2 is a block diagram of a system 200 in examples of this description. The system 200 includes an input buffer 202 to receive an input X (e.g., an input image 102 or an output provided by a previous layer 104). As described below, the input X is a digital input and a digital-to-analog converter (DAC, not shown in FIG. 2) converts the digital inputs X to analog voltage (Va) inputs, which are then provided to CIM array 204. For example, the DAC is implemented in the buffer 202, or in between the buffer 202 and the CIM array 204. The CIM array 204 is configured to store filter weights W of a convolutional layer 104 (or a portion of a convolutional layer 104). The CIM array 204 is also configured to compute a dot product using the Va inputs and the filter weights W, and to provide the result of the dot product computation as outputs Y. In some examples, the outputs Y are analog voltages, while in other examples, the outputs Y are digital values (e.g., converted from analog voltages using an analog-to-digital converter (ADC)).

Figure 3:
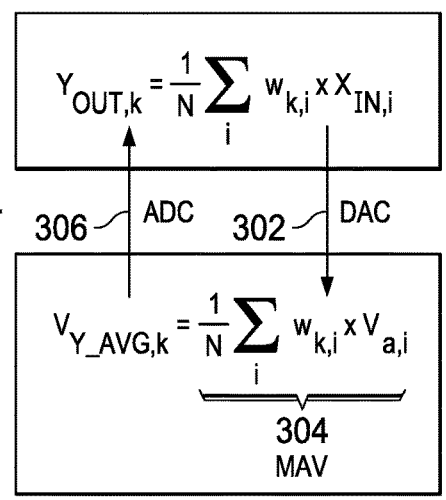
FIG. 3 is a block diagram of a dot product operation being applied in digital and analog domains in various examples.

FIG. 3 is an example 300 of a dot product operation for a layer 104 being applied in digital and analog domains in various examples. Examples of this description apply quantized filter weights (wk) to input values $X_{IN}$ to produce output values $Y_{OUT}$. Using quantized filter weights (e.g., binary or ternary weight values) reduces the memory used to store the filter weights while maintaining acceptable accuracy. Binary weights are represented by a single bit, while ternary bits are represented by two bits. For example, in a binary weighting scheme, a weight value of −1 is represented by a bit value of 1 and a weight value of +1 is represented by a bit value of 0. In another example, in a ternary weighting scheme, a weight value of −1 is represented by a bit value of 11, a weight value of +1 is represented by a bit value of 00, and a weight value of 0 is represented by either 01 or 10.

Providing digital inputs $X_{IN,i}$ to the CIM array 204 uses a relatively large number of wires (e.g., one wire per bit, with each digital input being multiple bits), introduces routing complexity, and can also increase area of the CIM array 204. It is thus useful to first convert digital inputs to analog voltages, which can each be provided to the CIM array 204 on a single wire. The example 300 includes a DAC stage 302 that converts the digital input values $X_{IN,i}$ to analog voltage inputs Va,i.

As described above, the filter weights used in the dot product operation are reduced to binary or ternary weights, such as by factoring out a scaling factor from initial weight values to simplify them to binary or ternary weight values. In these examples, the scaling factor is expressed as a ratio of two integers, M/N, where N is the number of inputs XIN (or Va). In this description, M is ignored for simplicity because it can be applied to scale a final result (e.g., YOUT), such as by multiplication (e.g., in the digital domain).

The example 300 also includes a multiply/average (MAV) stage 304 that multiplies each analog voltage input Va by a filter weight wk and then computes the average by summing the products and dividing that sum by N. The MAV stage 304 provides an analog output voltage $V_{Y\_AVG}$, which is also in the analog domain.

The example 300 includes an ADC stage 306 that converts the analog output voltage $V_{Y\_AVG}$ to digital output values YOUT. In the example 300, the initial inputs XIN are digital values, the filter weights wk stored in the CIM array 204 are digital values, and the outputs YOUT are digital values. However, the MAV stage 304 (e.g., the computation of the dot product) occurs in the analog domain, which increases efficiency because wiring complexity (e.g., to the CIM array 204) is reduced. As described below, certain portions of the computation performed in the MAV stage 304 also benefit from being performed in the analog domain.

Figure 4:
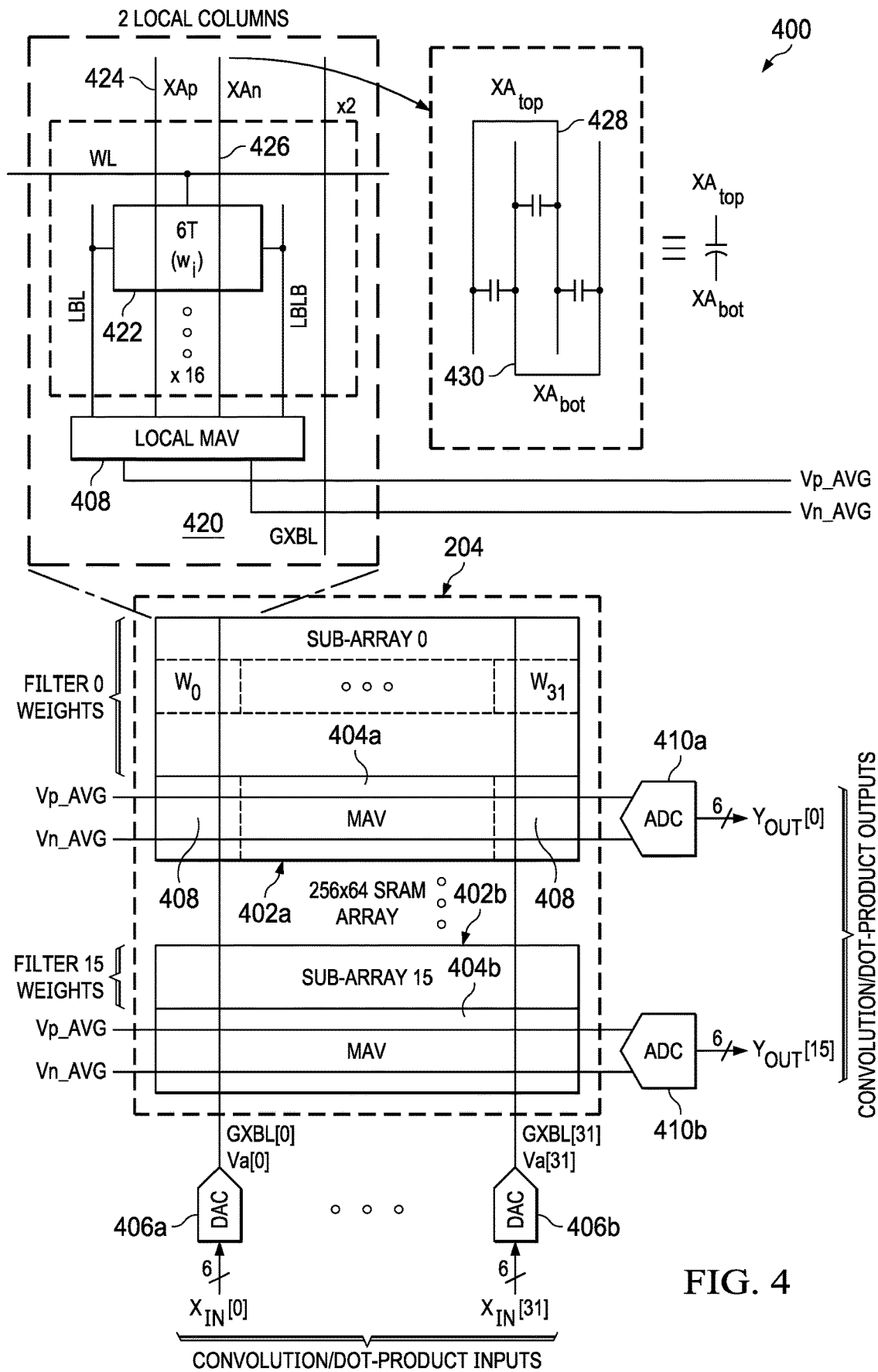
FIG. 4 is a block diagram of a system including a CIM array having multiply/average (MAV) circuits in various examples.

FIG. 4 is a block diagram of a system 400 including a CIM array 204 in various examples. The CIM array 204 is configured to store filter weights W of a convolutional layer 104 (or a portion of a convolutional layer 104). In the example of FIG. 4, the CIM array 204 is a SRAM array having 256 rows and 64 columns of bit cells. The CIM array 204 includes 16 sub-arrays 402a-402b, each of which has 16 rows and 64 columns of bit cells. Each sub-array 402 implements a filter of the convolutional layer 104. For example, the bit cells in sub-array 402a contain Filter 0 weights and the bit cells in 402b contain Filter 15 weights. In other examples, the size of the CIM array 204, the size of the sub-arrays 402, and/or the number of sub-arrays 402 can be different.

The CIM array 204 also includes 16 MAV circuit arrays 404a-404b, each coupled to one of the sub-arrays 402. For example, the MAV circuit array 404a is coupled to the sub-array 402a and the MAV circuit array 404b is coupled to the sub-array 402b. The MAV circuit arrays 404 are configured to facilitate the computations performed in the MAV stage 304, described above.

The system 400 includes DACs 406a-406b that are configured to receive a convolution or dot product input (e.g., digital input XIN) and provide an analog voltage input Va responsive to the received digital input XIN. As described above, in some examples the digital input is a multi-bit value, and so the DACs 406 are useful to reduce the wiring to the CIM array 204 by providing an analog input (e.g., single wire) rather than a digital input (e.g., multiple wires). In the example of FIG. 4, power consumed by the DACs 406 is also reduced due to each DAC 406 driving a single wire rather than multiple wires.

As described above, in the example of FIG. 4, the CIM array 204 has 64 columns of bit cells. However, in some examples, bit cells in a row are grouped into pairs, such as to implement a ternary weighting scheme where the grouped pair of bit cells represents a ternary filter weight. Grouping bit cells in a row into pairs effectively reduces the number of columns in the CIM array 204 by half (e.g., the CIM array 204 has 32 effective columns). As described below, each MAV circuit array 404 includes a local MAV circuit 408 for each of the 32 effective columns of the CIM array 204 (or sub-array 402). In the example of FIG. 4, each of 32 DACs 406 is configured to couple to the local MAV circuits 408 in a column of the CIM array 204 (e.g., by interconnect GXBL) to provide an analog voltage input to the local MAV circuits 408 in a column of the CIM array 204 (or sub-array 402). For example, GXBL[0] couples a first DAC 406a output to the local MAV circuit 408 in column 0 of the MAV circuit array 404a for Filter 0, to the local MAV circuit 408 in column 0 of the MAV circuit array 404b for Filter 15, and to the local MAV circuits 408 in column 0 of the MAV circuit arrays 404 for Filters 1-14, which are not shown for simplicity. Similarly, GXBL[31] couples a second DAC 406b output to the local MAV circuit 408 in column 31 of the MAV circuit array 404a for Filter 0, to the local MAV circuit 408 in column 31 of the MAV circuit array 404b for Filter 15, and to the local MAV circuits 408 in column 31 of the MAV circuit arrays 404 for Filters 1-14, which are not shown for simplicity. Other DACs 406, which are also not shown for simplicity, similarly provide analog voltage inputs to local MAV circuits 408 in the other columns of the CIM array 204.

The system 400 also includes ADCs 410a-410b, each of which is configured to receive a pair of differential analog voltages (e.g., Vp_AVG and Vn_AVG, each of which also refers to an interconnect at the named voltage) from a MAV circuit array 404. The differential analog voltages received from a MAV circuit array 404 represent an average of the products of multiplying the analog voltage inputs Va from the DACs 406 with filter weights wk in the sub-array 402 (e.g., in a row of the sub-array 402) coupled to the MAV circuit array 404. The ADCs 410 are configured to provide a digital output YOUT that indicates a value of the received differential analog voltages (e.g., Vp_AVG minus Vn_AVG). In examples of this description, the ADCs 410 providing the digital output responsive to the received differential analog voltages reduces the impact of common mode noise on the calculation of the digital output YOUT. The digital output YOUT is a convolution or dot product output.

As described above, in the example of FIG. 4, the CIM array 204 has 256 rows of bit cells with 16 sub-arrays 402 that each includes 16 rows of bit cells. The MAV circuit array 404 for each sub-array 402 is thus configured to receive analog voltage inputs Va from the DACs 406, multiply each analog voltage input Va with a filter weight wk in one of the rows of the sub-array 402, and provide the differential analog voltages that are an average of the products of each analog voltage input Va with the filter weight wk in one of the rows of the sub-array 402. An ADC 410 receives the differential analog voltages (e.g., the computed average of products of inputs Va and filter weights wk) from the MAV circuit array 404 and provides the digital output YOUT as the convolution or dot product output. The ADCs 410 are thus configured to facilitate the ADC stage 306, described above.

FIG. 4 includes an expanded portion 420 of a column of a sub-array 402 including the local MAV circuit 408 for that column. The expanded portion 420 includes 16 rows of bit cells 422. The bit cells 422 are 6T bit cells in examples of this description. As described above, the bit cell 422 stores a filter weight wk. There is only one column of bit cells 422 in this example (e.g., to implement a binary weighting scheme). However, as described above, in other examples bit cells 422 in a row are grouped into pairs, such as to implement a ternary weighting scheme where the grouped pair of bit cells 422 represents a ternary filter weight.

The expanded portion 420 also includes a first capacitor 424 and a second capacitor 426 that are shared by the effective column of the sub-array 402. The first and second capacitors 424, 426 are coupled to the local MAV circuit 408. The first and second capacitors 424, 426 are fabricated on a metal layer that is separate from (e.g., above) a layer on which the 6T bit cell 422 is fabricated, and do not significantly add to the area of the sub-array 402 or the CIM array 204. In the example of FIG. 4, the second capacitor 426 is shown in detail as a metal top plate 428 and a metal bottom plate 430 that can be fabricated on the metal layer above the 6T bit cell 422. In an example, the top plate 428 and the bottom plate 430 are fabricated on the same metal layer above the 6T bit cell 422 and the capacitance provided by the first and second capacitors 424, 426 is primarily metal-to-metal wire capacitance. In other examples, multiple metal layers above the 6T bit cell 422 are available for fabrication, and one or more of the first and second capacitors 424, 426 are implemented as parallel capacitors on the multiple metal layers. Each effective column of the sub-arrays 402 includes first and second capacitors 424, 426.

The expanded portion 420 includes a first local bit line (LBL) and a second local bit line (LBLB) between the local MAV circuit 408 and the bit cells 422 in the column. In an example, the local bit lines LBL, LBLB are complementary. The expanded portion 420 also includes a word line (WL) that is coupled to each bit cell 422 in a particular row. As described below, the word line WL is activated (e.g., driven to logic high) to access (e.g., read from or write to) the bit cell 422. Examples of this description are generally directed to reading from the bit cell 422, such as to multiply an analog voltage input Va by a filter weight wk stored in the bit cell 422. To read from the bit cell 422, the local bit lines LBL, LBLB are pre-charged (e.g., to a supply voltage (Vdd)) and the word line WL is subsequently activated. One of the local bit lines is discharged responsive to the value stored in the bit cell 422. For example, responsive to the bit cell storing a 1, the bit line LBLB is discharged; responsive to the bit cell storing a 0, the bit line LBL is discharged.

The local MAV circuit 408 is configured to receive the analog voltage input Va from the GXBL interconnect and, during a DAC pre-charge stage, to couple the GXBL interconnect to the first and second capacitors 424, 426 to charge the first and second capacitors 424, 426 to Va. For example, the top plate 428 of each of the capacitors 424, 426 is charged to Va and the bottom plate 430 of each of the capacitors 424, 426 is coupled to a ground terminal. As described below, the local MAV circuit 408 is configured to discharge one of the first and second capacitors 424, 426 responsive to one of the bit lines LBL, LBLB being discharged responsive to the bit cell 422 being read. For example, the first capacitor 424 represents a positive voltage (XAp=Va) and the second capacitor 426 represents a negative voltage (XAn=−Va). Accordingly, responsive to the bit cell 422 storing a 1, which corresponds to a filter weight value of −1, the first capacitor 424 (corresponding to Va) is discharged and the second capacitor 426 (corresponding to −Va) remains charged. The capacitor 424, 426 that remains charged thus represents the product of Va*wk.

In examples of this description, the first and second capacitors 424, 426 store the variable analog voltage input Va without providing the analog voltage input to the bit cell 422 itself. This prevents the value (e.g., filter weight) stored in the bit cell 422 from being corrupted, such as by the application of a relatively low analog voltage to the bit cell 422 (e.g., to the bit lines LBL, LBLB). Also, variations that impact the transistors of the bit cell 422 do not impact the charge on the first and second capacitors 424, 426. Accordingly, the product of Va*wk computed by the local MAV circuit 408 discharging one of the capacitors 424, 426 (e.g., to a ground voltage) is also not affected by variations in the bit cell 422 transistors.

After the local MAV circuits 408 have computed the product of Va*wk for each column, the local MAV circuit 408 is configured to couple the first capacitor 424 (e.g., the top plate 428 of the first capacitor 424) for each column to the Vp_AVG interconnect, and to couple the second capacitor 426 (e.g., the top plate 428 of the second capacitor 426) for each column to the Vn_AVG interconnect. Accordingly, the first capacitors 424 for each column are coupled in parallel while the second capacitors 426 for each column are coupled in parallel. This has the effect of averaging the voltages on the first capacitors 424 from each column and providing the averaged voltage on the Vp_AVG interconnect. Similarly, this has the effect of averaging the voltages on the second capacitors 426 from each column and providing the averaged voltage on the Vn_AVG interconnect. As described below, the ADCs 410 are configured to provide a digital output YOUT that indicates a value of the received differential analog voltages (e.g., Vp_AVG minus Vn_AVG).

Figure 5:
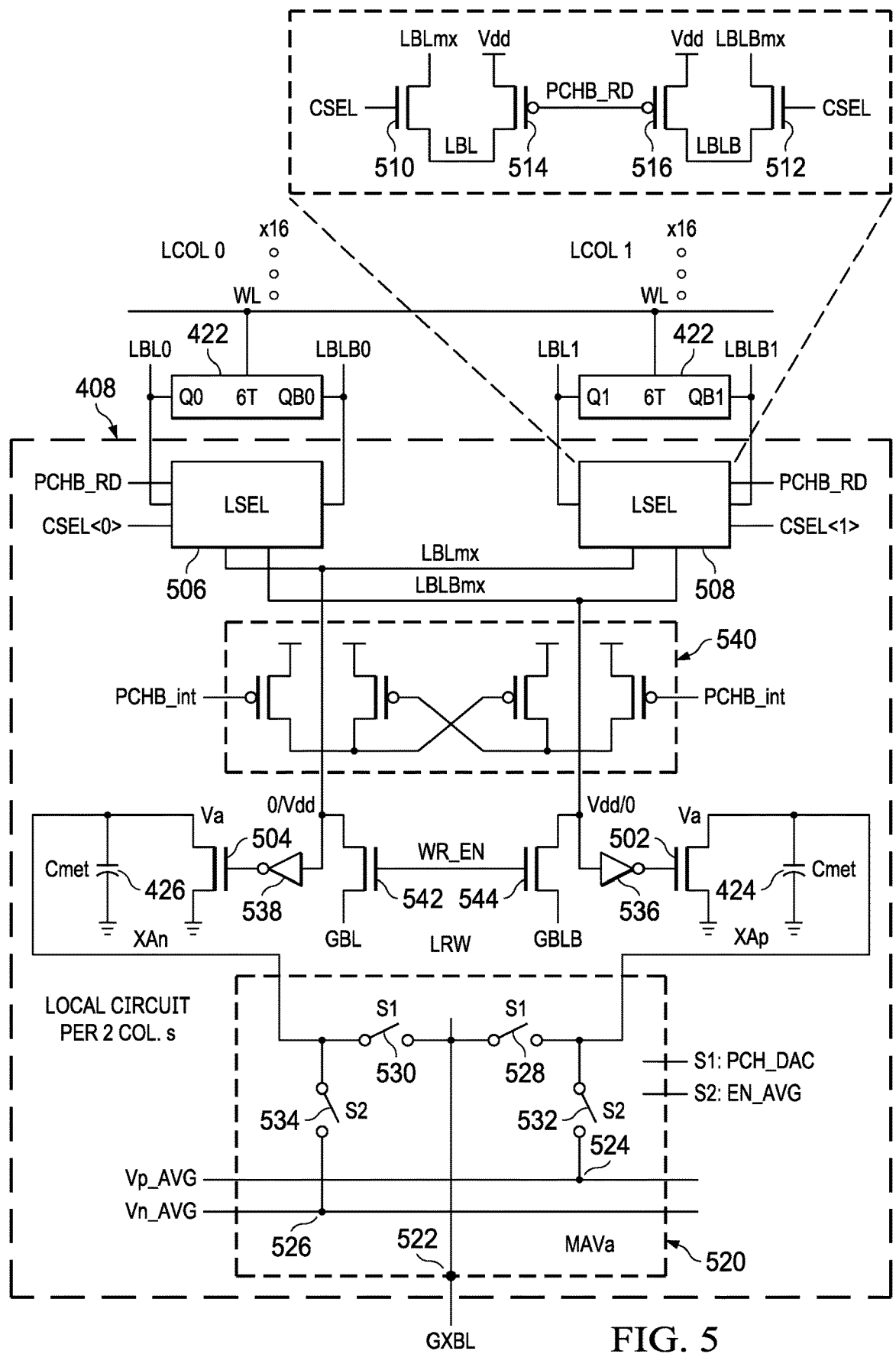
FIG. 5 is a schematic diagram of a local MAV circuit of a CIM array in various examples.

FIG. 5 is a schematic diagram of a local MAV circuit 408 of the CIM array 204 in examples of this description. In the example of FIG. 5, the local MAV circuit 408 is coupled to a pair of bit cells 422 (or pair of bit cell columns including the bit cells 422 shown in FIG. 5), such as to implement a ternary weighting scheme where the grouped pair of bit cells 422 represents a ternary filter weight. In some cases, the sizing of bit cells 422 in the CIM array 204 is such that a single column has sufficient area to implement one capacitor, but not both of the first and second capacitors 424, 426. Accordingly, in some examples in which a binary weighting scheme is used, pairs of adjacent columns of the CIM array 204 or the sub-arrays 402 are multiplexed to a single local MAV circuit 408 so the local MAV circuit 408 is coupled to a first capacitor 424 (e.g., implemented in a layer above the bit cell 422 in a first column of the pair of columns) and to a second capacitor 426 (e.g., implemented in a layer, possibly the same layer as first capacitor 424, above the bit cell 422 in a second column of the pair of columns), which enables differential voltage operations as described above.

In FIG. 5, the bit cells 422 include a first terminal (Q) and a second terminal (QB). The first terminal Q is coupled to a first bit line (LBL) and the second terminal QB is coupled to a second bit line (LBLB). As described above, a word line (WL) is coupled to the bit cells 422 in a given row. Also as described above, the local MAV circuit 408 is coupled to the first capacitor 424 and to the second capacitor 426. Although additional bit cells are not shown in FIG. 5 for simplicity, in some examples, 15 more rows of bit cells are coupled to the local MAV circuit 408 by the bit lines LBL, LBLB as shown.

The local MAV circuit 408 includes a first transistor 502 and a second transistor 504. The first transistor 502 is coupled to the first capacitor 424 and to a ground terminal. The second transistor 504 is coupled to the second capacitor 426 and to the ground terminal. The first and second transistors 502, 504 are configured to discharge the first and second capacitors 424, 426, respectively, responsive to being on. Responsive to the first and second transistors 502, 504 being off, the first and second capacitors 424, 426 are configured to be charged to the input voltage Va (e.g., responsive to the first and second capacitors 424, 426 being coupled to the GXBL interconnect).

The local MAV circuit 408 also includes a first select circuit 506 and a second select circuit 508. The select circuits 506, 508 are configured to selectively couple the bit lines LBL, LBLB to multiplexed bit lines LBLmx, LBLBmx, respectively. The select circuits 506, 508 are also configured to selectively couple the bit lines LBL, LBLB to a voltage source that provides the supply voltage Vdd to pre-charge the bit lines LBL, LBLB to facilitate reading the bit cell 422, as described above. For example, the expanded select circuit 508 includes transistors 510, 512 that selectively couple the bit lines LBL, LBLB to the multiplexed bit lines LBLmx, LBLBmx, respectively. The transistors 510, 512 are controlled by a CSEL signal. Responsive to the CSEL signal being logic high, the transistors 510, 512 are on and the bit lines LBL, LBLB are coupled to the multiplexed bit lines LBLmx, LBLBmx, respectively. The expanded select circuit 508 also includes transistors 514, 516 that selectively couple the bit lines LBL, LBLB to a supply voltage terminal, or to a voltage source that provides the supply voltage Vdd. The transistors 514, 516 are controlled by an inverted PCHB_RD signal. Responsive to PCHB_RD being logic low, the transistors 514, 516 are on and the bit lines LBL, LBLB are pre-charged to the supply voltage Vdd, such as to prepare to read the bit cell 422 as described above.

The local MAV circuit 408 also includes a switching network 520 that includes switches 528, 530, 532 and 534. These switches may be implemented by metal-oxide-silicon field-effect transistors (MOSFETs). The switching network 520 has an analog voltage input terminal 522 that is adapted to be coupled to the GXBL interconnect. The switching network 520 also has a positive output terminal 524 that is adapted to be coupled to the Vp_AVG interconnect. The switching network 520 also has a negative output terminal 526 that is adapted to be coupled to the Vn_AVG interconnect.

The switching network 520 is configured to facilitate the multiplication and averaging operations described above. For example, the switching network 520 includes a transistor 528 that is coupled to the analog voltage input terminal 522 and to the first capacitor 424. The switching network 520 also includes a transistor 530 that is coupled to the analog voltage input terminal 522 and to the second capacitor 426. The transistors 528, 530 are controlled by a PCH_DAC signal. Responsive to the PCH_DAC signal being logic high, the transistors 528, 530 are on and the first and second capacitors 424, 426 are pre-charged to the analog voltage input Va as described above.

The switching network 520 also includes a transistor 532 that is coupled to the positive output terminal 524 and to the first capacitor 424 (e.g., to the top plate 428 of the first capacitor 424, with the bottom plate 430 of the first capacitor 424 coupled to the ground terminal). The switching network 520 also includes a transistor 534 that is coupled to the negative output terminal 526 and to the second capacitor 426 (e.g., to the top plate 428 of the second capacitor 426, with the bottom plate 430 of the second capacitor 426 coupled to the ground terminal). The transistors 532, 534 are controlled by an EN_AVG signal. Responsive to the EN_AVG signal being logic high, the transistors 532, 534 are on and the first capacitor 424 is coupled in parallel to first capacitors across the sub-array 402 to which the local MAV circuit 408 is coupled. Similarly, the second capacitor 426 is coupled in parallel to second capacitors across the sub-array 402 to which the local MAV circuit 408 is coupled. Accordingly, responsive to the EN_AVG signal being logic high, the Vp_AVG interconnect provides a voltage that is an average of voltages on the first capacitors 424 across the sub-array 402 and the Vn_AVG interconnect provides a voltage that is an average of voltages on the second capacitors 426 across the sub-array 402. In some examples, the PCH_DAC and EN_AVG signals are not logic high at the same time, so the GXBL interconnect remains isolated from the Vp_AVG and Vn_AVG interconnects.

The local MAV circuit 408 also includes a first inverter 536 and a second inverter 538. The first inverter 536 output is coupled to a control terminal of the transistor 502 and the second inverter 538 output is coupled to a control terminal of the second transistor 504. The first inverter 536 input is coupled to the multiplexed bit line LBLBmx and the second inverter 538 input is coupled to the multiplexed bit line LBLmx.

The PCHB_int signal is a control signal that is similar to the PCHB_RD signal. In the example of FIG. 5, the local MAV circuit 408 includes a pull-up circuit 540 that is configured to drive the inputs of the inverters 536, 538 to the supply voltage Vdd responsive to PCHB_int being logic low. Accordingly, the outputs of the inverters 536, 538 are logic low, so the transistors 502, 504 are off, and the first and second capacitors 424, 426 are charged to Va responsive to being coupled to the GXBL interconnect. Responsive to PCHB_int being logic high, the multiplexed bit lines LBLBmx, LBLmx are provided to the inputs of the first and second inverters 536, 538, respectively.

The WR_EN signal is a write enable signal to facilitate writing data to the bit cells 422. In this example, the WR_EN signal controls transistors 542, 544 that couple global bit lines (GBL, GBLB, which are complementary) to the multiplexed bit lines LBLmx, LBLBmx, respectively. To write to a bit cell 422, the WR_EN signal is logic high, the CSEL signal is logic high, and the word line WL is logic high. Accordingly, the voltage on the global bit lines GBL, GBLB is provided to the local bit lines LBL, LBLB and written to the bit cell 422 as a bit.

The following examples demonstrate the functionality of the local MAV circuit 408 and the bit cell(s) 422 to apply (e.g., multiply) filter weights wk (stored in bit cells 422 in some example embodiments) to an analog voltage input Va and to provide a differential analog voltage output (e.g., by coupling the capacitor 424 to the Vp_AVG interconnect and coupling the capacitor 426 to the Vn_AVG interconnect). The differential analog voltage outputs of the local MAV circuits 408 in a row (e.g., the products of the filter weights wk and the analog voltage inputs Va[0]-Va[31] are averaged as a result of the capacitors 424, 426 of each local MAV circuit 408 in the row being coupled to the Vp_AVG and Vn_AVG interconnects, respectively.

In a first example, a binary weighting scheme is used and one of the bit cells 422 (e.g., in the right column of FIG. 5) is not used or is ignored. In this example, the bit cell 422 in the left column of FIG. 5 stores a bit value of 1, which corresponds to a filter weight of −1. To prepare to read the bit cell 422, the PCHB_RD signal is logic low and the select circuit 506 charges LBL0 and LBLB0 to Vdd. As described above, PCHB_int follows the PCHB_RD signal and the pull-up circuit 540 provides the supply voltage Vdd to the inputs of the inverters 536, 538, which causes the transistors 502, 504 to be off (e.g., de-coupling the first and second capacitors 424, 426 from the local MAV circuit 408 to prevent the first and second capacitors 424, 426 from discharging). The PCH_DAC signal is logic high, which causes the switching network 520 to turn on the transistors 528, 530 to charge the first and second capacitors 424, 426 to the analog voltage input, such as Va[0] in the case of the local MAV circuit 408 of the left-most column in FIG. 4.

Subsequently, such as after the bit lines LBL, LBLB are charged to Vdd, PCHB_RD transitions to logic high and the word line WL is activated, or logic high. Responsive to the WL being activated and the bit cell 422 storing a bit value of 1, the bit line LBLB is discharged and the bit line LBL remains charged to Vdd, which reads the value of the bit cell 422 onto to the bit lines LBL, LBLB.

Subsequently, such as after the first and second capacitors 424, 426 are charged to Va, PCH_DAC transitions to logic low to isolate the first and second capacitors 424, 426 from the GXBL interconnect. CSEL transitions to logic high, which couples the bit lines LBL, LBLB to the multiplexed bit lines LBLmx, LBLBmx, respectively. Responsive to LBLB being discharged as described above, LBLBmx is logic low, the first inverter 536 output is logic high, and the first transistor 502 is on, which discharges the first capacitor 424. Responsive to LBL still being charged to Vdd, LBLmx is logic high, the second inverter 538 output is logic low, the second transistor 504 is off, and the second capacitor 426 remains charged to the analog voltage input Va. As described above, the second capacitor 426 represents a negative voltage, and the second capacitor 426 remaining charged represents the product of the multiplication of the analog voltage input Va and the filter weight of −1 in this example.

Subsequently, such as after the multiplication operation is complete and one of the capacitors 424, 426 is discharged, CSEL transitions to logic low and EN_AVG transitions to logic high. Responsive to the EN_AVG signal being logic high, the switching network 520 turns on the transistors 532, 534. Responsive to the transistors 532, 534 being on, the first capacitor 424 is coupled in parallel to first capacitors across the sub-array 402 to which the local MAV circuit 408 is coupled (such as sub-array 402a). Similarly, the second capacitor 426 is coupled in parallel to second capacitors across the sub-array 402 to which the local MAV circuit 408 is coupled. Accordingly, responsive to the EN_AVG signal being logic high, the Vp_AVG interconnect provides a voltage that is an average of voltages on the first capacitors 424 across the sub-array 402 and the Vn_AVG interconnect provides a voltage that is an average of voltages on the second capacitors 426 across the sub-array 402.

In a second example, a binary weighting scheme is used and one of the bit cells 422 (e.g., in the right column of FIG. 5) is not used or is ignored. In this example, the bit cell 422 in the left column of FIG. 5 stores a bit value of 0, which corresponds to a filter weight of +1. To prepare to read the bit cell 422, the PCHB_RD signal is logic low and the select circuit 506 charges LBL0 and LBLB0 to Vdd. As described above, PCHB_int follows the PCHB_RD signal and the pull-up circuit 540 provides the supply voltage Vdd to the inputs of the inverters 536, 538, which causes the transistors 502, 504 to be off (e.g., de-coupling the first and second capacitors 424, 426 from the local MAV circuit 408). The PCH_DAC signal is logic high, which causes the switching network 520 to turn on the transistors 528, 530 to charge the first and second capacitors 424, 426 to Va (e.g., the analog voltage input).

Subsequently, such as after the bit lines LBL, LBLB are charged to Vdd, PCHB_RD transitions to logic high and the word line WL is activated, or logic high. Responsive to the WL being activated and the bit cell 422 storing a bit value of 0, the bit line LBL is discharged and the bit line LBLB remains charged to Vdd, which reads the value of the bit cell 422 onto to the bit lines LBL, LBLB.

Subsequently, such as after the first and second capacitors 424, 426 are charged to Va, PCH_DAC transitions to logic low to isolate the first and second capacitors 424, 426 from the GXBL interconnect. CSEL transitions to logic high, which couples the bit lines LBL, LBLB to the multiplexed bit lines LBLmx, LBLBmx, respectively. Responsive to LBL being discharged as described above, LBLmx is logic low, the second inverter 538 output is logic high, and the second transistor 504 is on, which discharges the second capacitor 426. Responsive to LBLB still being charged to Vdd, LBLBmx is logic high, the first inverter 536 output is logic low, the first transistor 502 is off, and the first capacitor 424 remains charged to the analog voltage input Va. As described above, the first capacitor 424 represents a positive voltage, and the first capacitor 424 remaining charged represents the product of the multiplication of the analog voltage input Va and the filter weight of +1 in this example.

Subsequently, such as after the multiplication operation is complete and one of the capacitors 424, 426 is discharged, CSEL transitions to logic low and EN_AVG transitions to logic high. Responsive to the EN_AVG signal being logic high, the switching network 520 turns on the transistors 532, 534. Responsive to the transistors 532, 534 being on, the first capacitor 424 is coupled in parallel to first capacitors across the sub-array 402 to which the local MAV circuit 408 is coupled. Similarly, the second capacitor 426 is coupled in parallel to second capacitors across the sub-array 402 to which the local MAV circuit 408 is coupled. Accordingly, responsive to the EN_AVG signal being logic high, the Vp_AVG interconnect provides a voltage that is an average of voltages on the first capacitors 424 across the sub-array 402 and the Vn_AVG interconnect provides a voltage that is an average of voltages on the second capacitors 426 across the sub-array 402.

In third, fourth, and fifth examples, a ternary weighting scheme is used and the filter weight is stored using both of the bit cells 422. In the third example, the bit cells 422 store bit value 11, which corresponds to a filter weight of −1. This example is similar to the first example above, except that CSEL<0> and CSEL<1> transition to logic high in a time multiplexed manner. For example, CSEL<0> first transitions to logic high. Accordingly, the bit lines LBL0, LBLB0 are first coupled to the multiplexed bit lines LBLmx, LBLBmx, respectively, which discharges the first capacitor 424 in this third example. Subsequently, such as after CSEL<0> transitions to logic low, CSEL<1> transitions to logic high. Accordingly, the bit lines LBL1, LBLB1 are then coupled to the multiplexed bit lines LBLmx, LBLBmx, respectively, which would also discharge the first capacitor 424, but which has already been discharged. In this third example, the second capacitor 426 remains charged to Va as described above in the first example. As described above, the second capacitor 426 represents a negative voltage, and the second capacitor 426 remaining charged represents the product of the multiplication of the analog voltage input Va and the filter weight of −1 in this example.

In the fourth example, the bit cells 422 store bit value 00, which corresponds to a filter weight of +1. This example is similar to the second example above, except that CSEL<0> and CSEL<1> transition to logic high in a time multiplexed manner. For example, CSEL<0> first transitions to logic high. Accordingly, the bit lines LBL0, LBLB0 are first coupled to the multiplexed bit lines LBLmx, LBLBmx, respectively, which discharges the second capacitor 426 in this fourth example. Subsequently, such as after CSEL<0> transitions to logic low, CSEL<1> transitions to logic high. Accordingly, the bit lines LBL1, LBLB1 are then coupled to the multiplexed bit lines LBLmx, LBLBmx, respectively, which would also discharge the second capacitor 426, but which has already been discharged. In this fourth example, the first capacitor 424 remains charged to Va as described above in the second example. As described above, the first capacitor 424 represents a positive voltage, and the first capacitor 424 remaining charged represents the product of the multiplication of the analog voltage input Va and the filter weight of +1 in this example.

In the fifth example, the bit cells 422 store bit value 01 or 10 (e.g., the bit cells 422 contain complementary values), which corresponds to a filter weight of 0. This example is similar to the third and fourth examples above. For example, CSEL<0> first transitions to logic high. Accordingly, the bit lines LBL0, LBLB0 are first coupled to the multiplexed bit lines LBLmx, LBLBmx, respectively, which discharges one of the capacitors 424, 426. Subsequently, such as after CSEL<0> transitions to logic low, CSEL<1> transitions to logic high. Accordingly, the bit lines LBL1, LBLB1 are then coupled to the multiplexed bit lines LBLmx, LBLBmx, respectively, which discharge the other of the capacitors 424, 426. In this fifth example, both capacitors 424, 426 are discharged following the time multiplexed operation of the CSEL signals. Accordingly, the capacitors 424, 426 represent the product of the multiplication of the analog voltage input Va and the filter weight of 0 in this example.

Irrespective of whether a binary or ternary weighting scheme is employed, the product of multiplying an analog voltage input Va by a filter weight wk is stored on the first and second capacitors 424, 426 in a differential manner. Subsequently, such as after the multiplication operation is complete and one or both of the capacitors 424, 426 are discharged, EN_AVG transitions to logic high. Accordingly, the Vp_AVG interconnect provides the average of the voltages on the first capacitors 424 across the sub-array 402, and the Vn_AVG interconnect provides the average of the voltages on the second capacitors 426 across the sub-array 402. As described below, in other examples, the ADCs 410 are configured to provide a digital output YOUT that indicates a value of the received differential analog voltages (e.g., Vp_AVG minus Vn_AVG).

Figure 6:
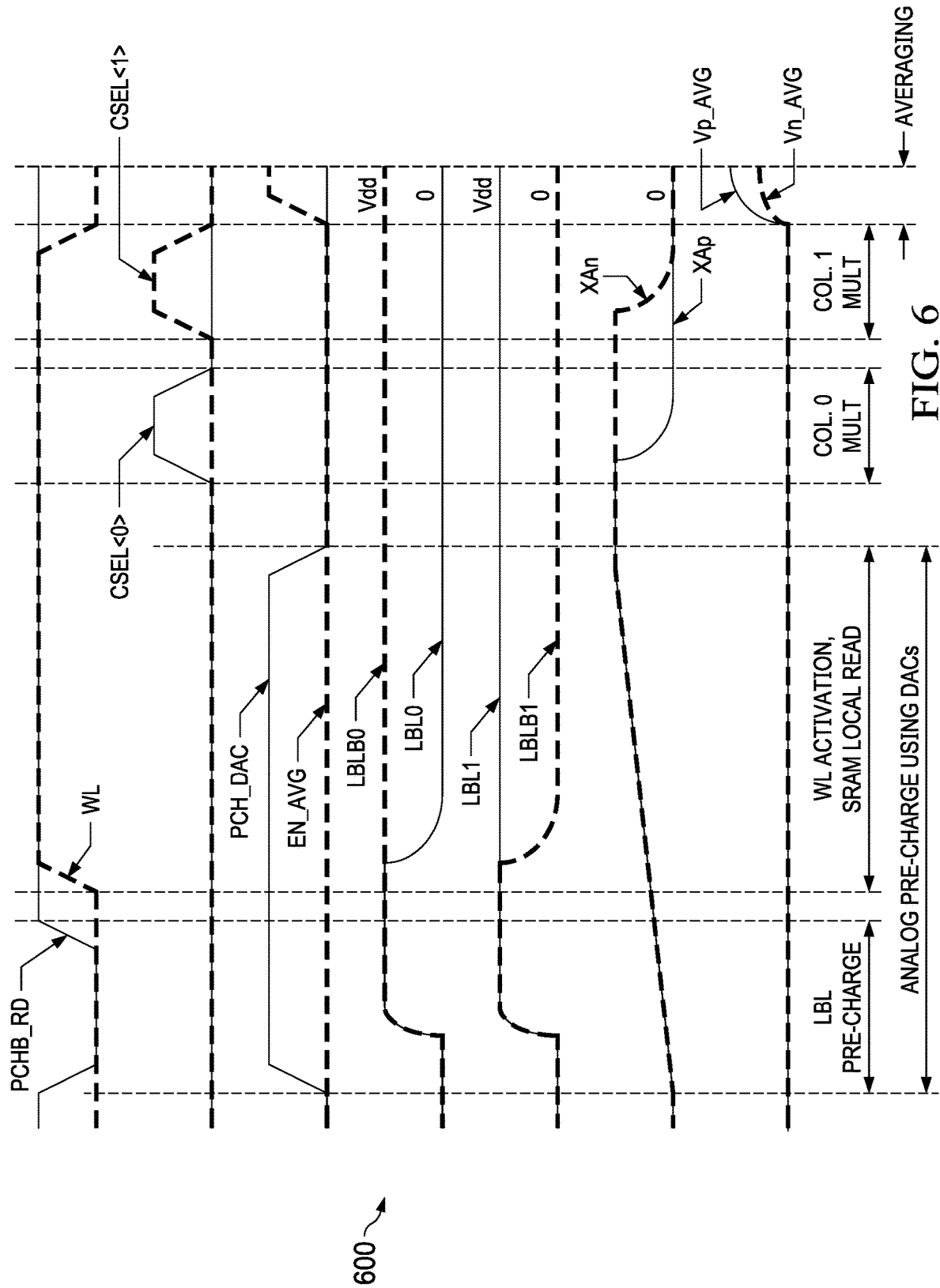
FIG. 6 is a graph of waveforms representing operation of the MAV circuit of FIG. 5.

FIG. 6 is graph of waveforms 600 representing operation of the local MAV circuit 408 of FIG. 5. In the waveforms 600, PCHB_RD represents a voltage of the PCHB_RD (and PCHB_int) signals described above; WL represents a voltage of the word line described above; CSEL<0> represents a voltage of the CSEL signal provided to the left select circuit 506; CSEL<1> represents a voltage of the CSEL signal provided to the right select circuit 506; PCH_DAC represents a voltage of the control signal provided to the switching network 520 to control the transistors 528, 530; EN_AVG represents a voltage of the control signal provided to the switching network 520 to control the transistors 532, 534; LBL0 and LBLB0 represent voltages of the bit lines of the left bit cell 422; LBL1 and LBLB1 represent voltages of the bit lines of the right bit cell 422; XAp and XAn represent the voltages on the first and second capacitor 424, 426, respectively; and Vp_AVG and Vn_AVG represent voltages on the Vp_AVG and Vn_AVG interconnects, respectively. In the example of FIG. 6, a ternary weighting scheme is used and the filter weight is stored using both of the bit cells 422 and the bit cells 422 store bit value 01 (e.g., the bit cells 422 contain complementary values), which corresponds to a filter weight of 0.

During an LBL pre-charge phase, to prepare to read the bit cell 422, the PCHB_RD signal is logic low and the select circuit 506 charges LBL0 and LBLB0 to Vdd. The select circuit 508 also charges LBL1 and LBLB1 to Vdd.

During a DAC pre-charge phase, which occurs at the same time as the LBL pre-charge phase in some examples, the PCH_DAC signal is logic high and the first and second capacitors 424, 426 are charged to Va (e.g., the analog voltage input), and, at this point, lines XAn and XAp are also at the Va potential.

Subsequently, such as after the bit lines LBL, LBLB are charged to Vdd, PCHB_RD transitions to logic high and the LBL pre-charge phase ends. The word line WL is activated, or logic high, which begins a local read phase. In the example of FIG. 6, during the local read phase, responsive to the WL being activated and the bit cell 422 in the left column storing a bit value of 0, the bit line LBL0 is discharged and the bit line LBLB0 remains charged to Vdd, which reads the value of the bit cell 422 in the left column onto to the bit lines LBL0, LBLB0. Also during the local read phase, responsive to the WL being activated and the bit cell 422 in the right column storing a bit value of 1, the bit line LBLB1 is discharged and the bit line LBL1 remains charged to Vdd, which reads the value of the bit cell 422 in the right column onto to the bit lines LBL1, LBLB1.

Subsequently, such as after the first and second capacitors 424, 426 are charged to Va, PCH_DAC transitions to logic low to isolate the first and second capacitors 424, 426 from the GXBL interconnect and the DAC pre-charge phase ends.

As described above, CSEL<0> and CSEL<1> transition to logic high in a time multiplexed manner in the ternary weighted scheme. For example, CSEL<0> first transitions to logic high. Accordingly, the bit lines LBL0, LBLB0 are first coupled to the multiplexed bit lines LBLmx, LBLBmx, respectively, which discharges the first capacitor 424 (XAp) in this example. Subsequently, such as after CSEL<0> transitions to logic low, CSEL<1> transitions to logic high. Accordingly, the bit lines LBL1, LBLB1 are then coupled to the multiplexed bit lines LBLmx, LBLBmx, respectively, which discharges the second capacitor 426 (XAn). In this example, both capacitors 424, 426 are discharged following the time multiplexed operation of the CSEL signals. Accordingly, the capacitors 424, 426 represent the product of the multiplication of the analog voltage input Va and the filter weight of 0 in this example.

Subsequently, such as after the multiplication operation is complete and one or both of the capacitors 424, 426 are discharged, CSEL<1> transitions to logic low and EN_AVG transitions to logic high and an averaging phase begins. Responsive to the EN_AVG signal being logic high, the first capacitor 424 is coupled in parallel to first capacitors across the sub-array 402 to which the local MAV circuit 408 is coupled. Similarly, the second capacitor 426 is coupled in parallel to second capacitors across the sub-array 402 to which the local MAV circuit 408 is coupled. Accordingly, responsive to the EN_AVG signal being logic high, the Vp_AVG interconnect provides a voltage that is an average of voltages on the first capacitors 424 across the sub-array 402 and the Vn_AVG interconnect provides a voltage that is an average of voltages on the second capacitors 426 across the sub-array 402.

Figure 7:
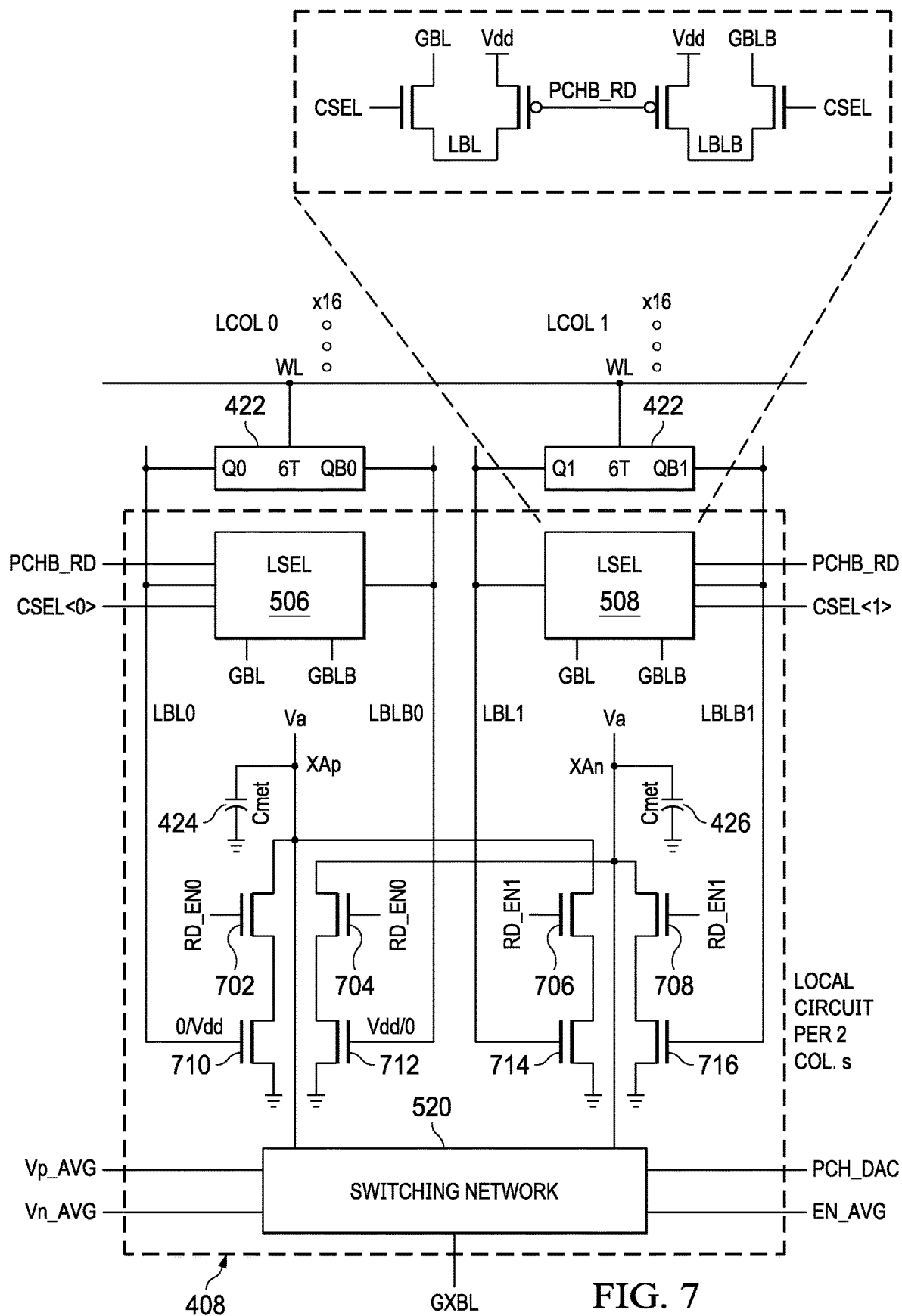
FIGS. 7 and 8 are schematic diagrams of local MAV circuits of CIM arrays in various examples.

FIG. 7 is a schematic diagram of another example of a local MAV circuit 408 of the CIM array 204 in examples of this description. The local MAV circuit 408 of FIG. 7 is functionally similar to the local MAV circuit 408 of FIG. 5, and like-numbered elements in FIG. 7 generally function (and may have the same structure/layout) as those elements described above in FIG. 5. The local MAV circuit 408 of FIG. 7 differs from the local MAV circuit 408 of FIG. 5 as follows.

The local MAV circuit 408 includes read transistors 702, 704, 706, 708 and bit cell transistors 710, 712, 714, 716. The read transistor 702 is coupled to the first capacitor 424 and to the bit cell transistor 710. The bit cell transistor 710 is also coupled to the ground terminal. The read transistor 704 is coupled to the second capacitor 426 and to the bit cell transistor 712. The bit cell transistor 712 is also coupled to the ground terminal. The read transistor 706 is coupled to the first capacitor 424 and to the bit cell transistor 714. The bit cell transistor 714 is also coupled to the ground terminal. The read transistor 708 is coupled to the second capacitor 426 and to the bit cell transistor 716. The bit cell transistor 716 is also coupled to the ground terminal.

The read transistors 702-708 and the bit cell transistors 710-716 together are configured to discharge the first and/or second capacitors 424, 426, responsive to being on. Responsive to the read transistors 702-708 being off, the first and second capacitors 424, 426 are configured to be charged to the input voltage Va (e.g., responsive to the first and second capacitors 424, 426 being coupled to the GXBL interconnect through the switching network 520).

The select circuits 506, 508 function as described above with respect to pre-charging the bit lines LBL, LBLB to facilitate reading the bit cell 422. In FIG. 7, the select circuits 506, 508 are not used for reading from the bit cell 422 but are still used for writing to the bit cell 422. For example, responsive to the CSEL signals being logic high, the select circuits 506, 508 couple global bit lines (GBL, GBLB, which are complementary) to the local bit lines LBL, LBLB, respectively. To write to a bit cell 422, the CSEL signal is logic high and the word line WL is logic high. Accordingly, the voltage on the global bit lines GBL, GBLB is provided to the local bit lines LBL, LBLB and written to the bit cell 422 as a bit.

The switching network 520 functions as generally described above. For example, responsive to the PCH_DAC signal being logic high, the first and second capacitors 424, 426 are pre-charged to the analog voltage input Va as described above. Responsive to the EN_AVG signal being logic high, the first capacitor 424 is coupled in parallel to first capacitors across the sub-array 402 to which the local MAV circuit 408 is coupled. Similarly, the second capacitor 426 is coupled in parallel to second capacitors across the sub-array 402 to which the local MAV circuit 408 is coupled. Accordingly, responsive to the EN_AVG signal being logic high, the Vp_AVG interconnect provides a voltage that is an average of voltages on the first capacitors 424 across the sub-array 402 and the Vn_AVG interconnect provides a voltage that is an average of voltages on the second capacitors 426 across the sub-array 402. In some examples, the PCH_DAC and EN_AVG signals are not logic high at the same time, so the GXBL interconnect remains isolated from the Vp_AVG and Vn_AVG interconnects.

The control terminals of the read transistors 702, 704 are configured to receive a first RD_EN signal (RD_EN0) and the control terminals of the read transistors 706, 708 are configured to receive a second RD_EN signal (RD_EN1). The RD_EN signals are similar to the CSEL signals described above with regard to the read operation. For example, responsive to the RD_EN0 signal being logic high, the read transistors 702, 704 are on and one of the first and second capacitors 424, 426 is discharged responsive to the filter weight stored in the bit cell 422 in the left column (e.g., responsive to one of the bit lines LBL0, LBLB0 being discharged responsive to the filter weight stored in the bit cell 422 in the left column). Similarly, responsive to the RD_EN1 signal being logic high, the read transistors 706, 708 are on and one of the first and second capacitors 424, 426 is discharged responsive to the filter weight stored in the bit cell 422 in the right column (e.g., responsive to one of the bit lines LBL1, LBLB1 being discharged responsive to the filter weight stored in the bit cell 422 in the left column). In the example of FIG. 7, the RD_EN signals do not need to be time multiplexed (e.g., can be applied simultaneously), which reduces timing overhead, such as in the ternary weighting scheme example in which the filter weight is read from both of the bit cells 422.

The example of FIG. 7 also reduces the likelihood of capacitor voltage leakage from the first and second capacitors 424, 426 because two transistors are stacked (e.g., read transistor and bit cell transistor 702/710, 704/712, 706/714, 708/716) to discharge the capacitors 424, 426.

Irrespective of whether a binary or ternary weighting scheme is employed, the product of multiplying an analog voltage input Va by a filter weight wk is stored on the first and second capacitors 424, 426 in a differential manner. Subsequently, such as after the multiplication operation is complete and one or both of the capacitors 424, 426 are discharged, EN_AVG transitions to logic high. Accordingly, the Vp_AVG interconnect provides the average of the voltages on the first capacitors 424 across the sub-array 402, and the Vn_AVG interconnect provides the average of the voltages on the second capacitors 426 across the sub-array 402. As described below, in other examples, the ADCs 410 are configured to provide a digital output YOUT that indicates a value of the received differential analog voltages (e.g., Vp_AVG minus Vn_AVG).

Figure 8:
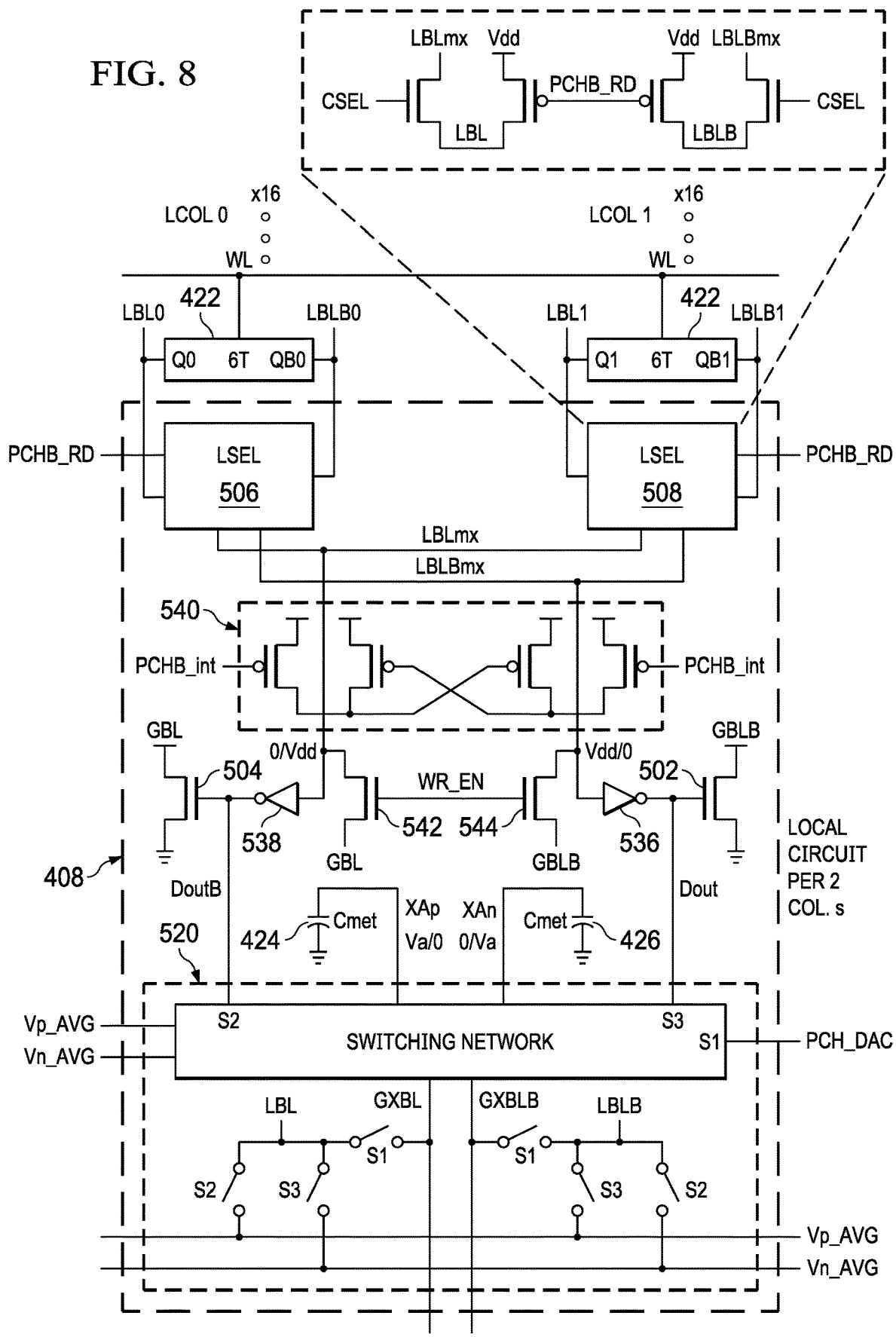

FIG. 8 is a schematic diagram of another example of a local MAV circuit 408 of the CIM array 204 in examples of this description. The local MAV circuit 408 of FIG. 8 is functionally similar to the local MAV circuit 408 of FIG. 5, and like-numbered elements in FIG. 8 generally function (and may have the same structure/layout) as those elements described above in FIG. 8. The local MAV circuit 408 of FIG. 8 differs from the local MAV circuit 408 of FIG. 5 as follows.

The local MAV circuit 408 is generally similar to those described above with respect to FIGS. 5 and 7. However, in the example of FIG. 8, the analog voltage input is provided in a differential manner on GXBL and GXBLB interconnects. For example, an analog voltage input of Va is provided by the GXBL interconnect providing the voltage Va and the GXBLB interconnect providing a voltage of 0. As another example, an analog voltage input of −Va is provided by the GXBL interconnect providing a voltage of 0 and the GXBLB interconnect providing the voltage Va.

The select circuits 506, 508 function as described above with respect to pre-charging the bit lines LBL, LBLB and to facilitate reading the bit cell 422. The switching network 520 functions as generally described above, with the following differences. Similar to above, responsive to the PCH_DAC signal being logic high, the first and second capacitors 424, 426 are pre-charged. However, the first capacitor 424 is pre-charged to the voltage on the GXBL interconnect and the second capacitor 426 is pre-charged to the voltage on the GXBLB interconnect.

Subsequently, once the first and second capacitors 424, 426 are pre-charged to the respective voltages, the switching network 520 evaluates internal signals Dout and DoutB. Dout is a signal provided by the output of the inverter 536, which is logic high or logic low responsive to the multiplexed bit line LBLBmx being logic low or logic high, respectively. DoutB is a signal provided by the output of the inverter 538, which is logic high or logic low responsive to the multiplexed bit line LBLmx being logic low or logic high, respectively. The Dout signal controls switches S3 of the switching network 520. Responsive to the switches S3 being closed, the first capacitor 424 is coupled to the Vn_AVG interconnect and the second capacitor 426 is coupled to the Vp_AVG interconnect. The DoutB signal controls switches S2 of the switching network 520. Responsive to the switches S2 being closed, the first capacitor 424 is coupled to the Vp_AVG interconnect and the second capacitor 426 is coupled to the Vn_AVG interconnect.

The example of FIG. 8 reduces the power used to charge the first and second capacitors 424, 426 with an analog voltage input because only one of the capacitors 424, 426 is charged for an operation. In this example, rather than discharging one of the capacitors 424, 426 to the ground terminal as described above, the multiplication operation is performed by coupling the capacitors 424, 426 to Vp_AVG and Vn_AVG, respectively, or the opposite (e.g., Vn_AVG and Vp_AVG, respectively). The function of the example local MAV circuit 408 of FIG. 8 is described below.

In first and second examples, an analog input voltage is Va, and thus the GXBL interconnect provides voltage Va and the GXBLB interconnect provides voltage 0. Accordingly, the first capacitor 424 is charged to Va and the second capacitor 426 is charged to 0. In the first example, the left column bit cell 422 has a value 0, which corresponds to a filter weight of +1. The select circuit 506 reads the bit cell 422, which discharges LBLmx and LBLBmx remains charged (e.g., to Vdd).

Responsive to LBLmx being discharged, DoutB is logic high, which closes the S2 switches. Responsive to LBLBmx remaining charged, Dout is logic low, and the S3 switches remain open. Accordingly, the GXBL interconnect and/or the first capacitor 424 voltage (Va) is provided to the Vp_AVG interconnect and the GXBLB interconnect and/or the second capacitor 426 voltage (0) is provided to the Vn_AVG interconnect, which results in a positive differential voltage (e.g., positive input voltage Va x+1 filter weight).

In the second example, the left column bit cell 422 has a value 1, which corresponds to a filter weight of −1. The select circuit 506 reads the bit cell 422, which discharges LBLBmx and LBLmx remains charged (e.g., to Vdd).

Responsive to LBLBmx being discharged, Dout is logic high, which closes the S3 switches. Responsive to LBLmx remaining charged, DoutB is logic low, and the S2 switches remain open. Accordingly, the GXBLB interconnect and/or the second capacitor 426 voltage (0) is provided to the Vp_AVG interconnect and the GXBL interconnect and/or the first capacitor 424 voltage (Va) is provided to the Vn_AVG interconnect, which results in a negative differential voltage (e.g., positive input voltage Va x−1 filter weight).

In third and fourth examples, an analog input voltage is −Va, and thus the GXBL interconnect provides voltage 0 and the GXBLB interconnect provides voltage Va. The example of FIG. 8 enables analog voltage input values that are either positive or negative. Accordingly, the first capacitor 424 is charged to 0 and the second capacitor 426 is charged to Va. In the third example, the left column bit cell 422 has a value 0, which corresponds to a filter weight of +1. The select circuit 506 reads the bit cell 422, which discharges LBLmx and LBLBmx remains charged (e.g., to Vdd).

Responsive to LBLmx being discharged, DoutB is logic high, which closes the S2 switches. Responsive to LBLBmx remaining charged, Dout is logic low, and the S3 switches remain open. Accordingly, the GXBL interconnect and/or the first capacitor 424 voltage (0) is provided to the Vp_AVG interconnect and the GXBLB interconnect and/or the second capacitor 426 voltage (Va) is provided to the Vn_AVG interconnect, which results in a negative differential voltage (e.g., negative input voltage −Va x+1 filter weight).

In the fourth example, the left column bit cell 422 has a value 1, which corresponds to a filter weight of −1. The select circuit 506 reads the bit cell 422, which discharges LBLBmx and LBLmx remains charged (e.g., to Vdd).

Responsive to LBLBmx being discharged, Dout is logic high, which closes the S3 switches. Responsive to LBLmx remaining charged, DoutB is logic low, and the S2 switches remain open. Accordingly, the GXBLB interconnect and/or the second capacitor 426 voltage (Va) is provided to the Vp_AVG interconnect and the GXBL interconnect and/or the first capacitor 424 voltage (0) is provided to the Vn_AVG interconnect, which results in a positive differential voltage (e.g., negative input voltage −Va x−1 filter weight).

Accordingly, the product of multiplying an analog voltage input Va, which may be a positive or negative value, by a filter weight wk is provided to the Vp_AVG and Vn_AVG interconnects in a differential manner, which provide the average of voltages across the sub-array 402 as described above. As described below, in other examples, the ADCs 410 are configured to provide a digital output YOUT that indicates a value of the received differential analog voltages (e.g., Vp_AVG minus Vn_AVG).

Figure 9:
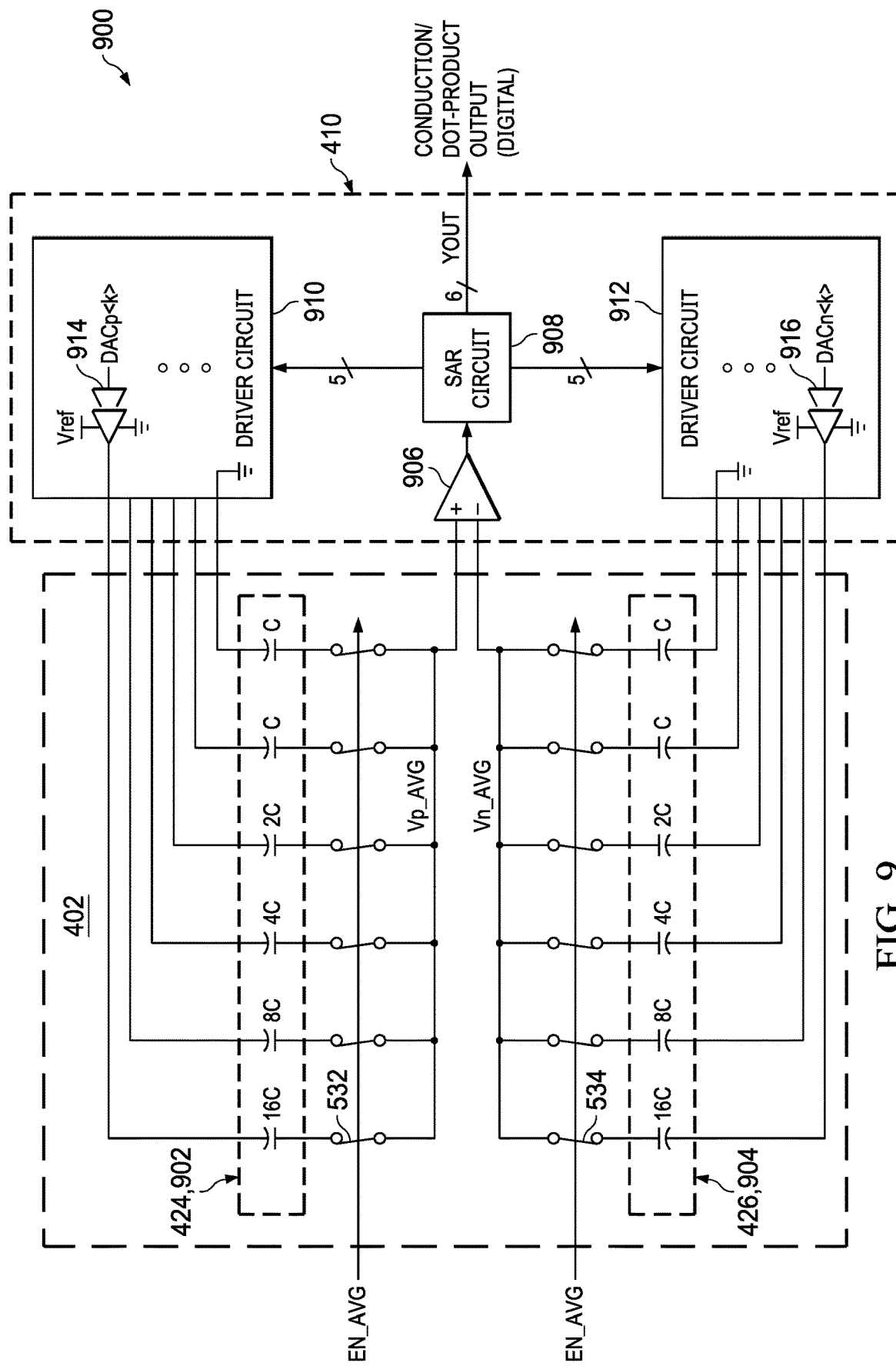
FIG. 9 is a schematic diagram of an analog-to-digital converter (ADC) coupled to a CIM array in various examples.

FIG. 9 is a schematic diagram of a system 900 that includes an ADC 410 in various examples. FIG. 9 includes a portion of a sub-array 402 of the CIM array 204 described above. In FIG. 9, the system 900 includes the first capacitors 424, referred to in FIG. 9 as positive differential capacitors 902 because their voltage represents a positive voltage (e.g., XAp=Va as described above). The system 900 also includes the second capacitors 426, referred to in FIG. 9 as negative differential capacitors 904 because their voltage represents a negative voltage (e.g., XAn=−Va as described above).

In FIG. 9, the EN_AVG signal is logic high, and so the Vp_AVG interconnect is coupled to the top plates of the positive differential capacitors 902, and the Vn_AVG interconnect is coupled to the top plates of the negative differential capacitors 904. Responsive to the EN_AVG signal being logic high, the Vp_AVG interconnect provides a voltage that is an average of voltages on the positive differential capacitors 902 across the sub-array 402. Also responsive to the EN_AVG signal being logic high, the Vn_AVG interconnect provides a voltage that is an average of voltages on the negative differential capacitors 904 across the sub-array 402. The voltage on the Vp_AVG interconnect is referred to as a positive differential voltage (or Vp) and the voltage on the Vn_AVG interconnect is referred to as a negative differential voltage (or Vn). As described above, for each sub-array 402, an ADC 410 is coupled to the Vp_AVG and Vn_AVG interconnects of that sub-array. Accordingly, the ADC 410 is configured to receive the positive differential voltage and the negative differential voltage, and to provide a digital output YOUT that indicates a value of the received differential analog voltages (e.g., Vp_AVG minus Vn_AVG).

The ADC 410 in system 900 includes a comparator 906 that has a non-inverting input, an inverting input, and an output. In this example, the comparator 906 non-inverting input is coupled to the Vp_AVG interconnect (e.g., a first terminal coupled to top plates of the positive differential capacitors 902) and receives the positive differential voltage. The comparator 906 inverting input is coupled to the Vn_AVG interconnect (e.g., a second terminal coupled to top plates of the negative differential capacitors 904). Accordingly, the comparator 906 output provides an indication of a difference between the voltage on the Vp_AVG interconnect and the voltage on the Vn_AVG interconnect. For example, the comparator 906 output is logic high responsive to the voltage on the Vp_AVG interconnect being greater than the voltage on the Vn_AVG interconnect, and is logic low responsive to the voltage on the Vn_AVG interconnect being greater than the voltage on the Vp_AVG interconnect.

The ADC 410 includes a control circuit 908 that is coupled to the comparator 906 and receives the comparator 906 output. In these examples, the ADC 410 is a successive-approximation ADC 410 and the control circuit 908 is configured to implement a successive-approximation analog-to-digital conversion. The ADC 410 also includes a first driver circuit 910 and a second driver circuit 912. The first driver circuit 910 includes a first driver 914 that is configured to provide either a reference voltage (e.g., Vref) or a ground voltage responsive to an input to the first driver 914. For example, responsive to the first driver 914 input being logic high (e.g., an input bit value of 1), the first driver 914 output provides Vref; responsive to the first driver 914 input being logic low (e.g., an input bit value of 0), the first driver 914 output provides the ground voltage. The second driver 916 of the second driver circuit 912 functions similarly to the first driver 914. The first driver 914 output is coupled to bottom plates of a group of the positive differential capacitors 902 (e.g., a first group). The second driver 916 output is coupled to bottom plates of a group of the negative differential capacitors 904 (e.g., a second group).

In the example of FIG. 9, there are 32 positive differential capacitors 902 and 32 negative differential capacitors 904, or one positive differential capacitor 902 and one negative differential capacitor 904 for each of the 32 effective columns of the sub-array 402 as described above. In this example, the positive differential capacitors 902 are arranged in binary-weighed groups, including a group of 16 capacitors (16C), a group of 8 capacitors (8C), a group of 4 capacitors (4C), a group of 2 capacitors (2C) and two single capacitors (C). The negative differential capacitors 904 are arranged into like groups.

As indicated, the driver circuit 910 includes drivers 914 that each has an output coupled to a different one of the groups of the positive differential capacitors 902. For example, the driver circuit 910 includes five drivers 914 that provide their output voltages to the bottom plate(s) of one of the 16C group, the 8C group, the 4C group, the 2C group, or one of the C groups of the positive differential capacitors 902. The bottom plate of the remaining C group of the positive differential capacitors 902 is coupled to a ground terminal. Similarly, as indicated, the driver circuit 912 includes drivers 916 that each has an output coupled to a different one of the groups of the negative differential capacitors 904. For example, the driver circuit 912 includes five drivers 916 that provide their output voltages to the bottom plate(s) of one of the 16C group, the 8C group, the 4C group, the 2C group, or one of the C groups of the negative differential capacitors 904. The bottom plate of the remaining C group of the negative differential capacitors 904 is also coupled to the ground terminal.

The control circuit 908 provides output signals to the driver circuit 910 to control the output provided by each of the drivers 914. In this example, the control circuit 908 provides a 5-bit control signal to the driver circuit 910, where each bit of the control signal controls one of the drivers 914 as described above. The control circuit 908 also provides output signals to the driver circuit 912 to control the output provided by each of the drivers 916. In this example, the control circuit 908 provides a 5-bit control signal to the driver circuit 912, where each bit of the control signal controls one of the drivers 916 as described above.

In the example of FIG. 9, the control circuit 908 is configured to receive indications of the difference between the positive differential voltage and the negative differential voltage from the comparator 906. For example, these indications include whether the positive or negative differential voltage is the greater of the two values. The control circuit 908 is configured to provide the output signals to the driver circuit 910 and the output signals to the driver circuit 912 responsive to the indication received from the comparator 906. The control circuit 908 is also configured to provide a digital value (e.g., YOUT) as its output, which is the result of the dot product computation described above, and also the output of the ADC 410. The control circuit 908 provides the digital value responsive to one or more indications received from the comparator 906 and the output signals that it provides to the driver circuits 910, 912.

The following example demonstrates the functionality of the ADC 410 and the capacitors 902, 904 to provide the digital output (e.g., YOUT). As described above, responsive to the EN_AVG signal being logic high, the Vp_AVG interconnect initially provides a voltage that is an average of voltages on the top plates of the positive differential capacitors 902 across the sub-array 402. Also responsive to the EN_AVG signal being logic high, the Vn_AVG interconnect initially provides a voltage that is an average of voltages on the top plates of the negative differential capacitors 904 across the sub-array 402. At this initial time, the drivers 914, 916 of the driver circuits 910, 912 provide the ground voltage to the bottom plates of all the capacitors 902, 904.

During a first phase, the control circuit 908 receives an indication of the difference between the positive differential voltage (Vp) and the negative differential voltage (Vn) from the comparator 906 (e.g., a first indication). Responsive to the first indication, the control circuit 908 provides output signals to the driver circuits 910, 912 to cause one of the drivers 914, 916 to provide the reference voltage (Vref) to the bottom plates of one of the 16C groups and to cause the other of the drivers 914, 916 to provide the ground voltage to the bottom plates of the other of the 16C groups.

For example, responsive to Vp being greater than Vn, the control circuit 908 output signals cause the driver 916 to provide Vref to the bottom plates of the 16C group of the negative differential capacitors 904. Also responsive to Vp being greater than Vn, the control circuit 908 output signals cause the driver 914 to continue to provide the ground voltage to the bottom plates of the 16C group of the positive differential capacitors 902. Accordingly, the voltage on the top plates of the negative differential capacitors 904 increases by Vref/2 because the 16C group is half of the total of 32 negative differential capacitors 904. The voltage on the top plates of the positive differential capacitors 902 remains the same because the bottom plate voltage of the 16C group of the positive differential capacitors 902 did not change.

For example, responsive to Vn being greater than Vp, the control circuit 908 output signals cause the driver 914 to provide Vref to the bottom plates of the 16C group of the positive differential capacitors 902. Also responsive to Vn being greater than Vp, the control circuit 908 output signals cause the driver 916 to continue to provide the ground voltage to the bottom plates of the 16C group of the negative differential capacitors 904. Accordingly, the voltage on the top plates of the positive differential capacitors 902 increases by Vref/2, while the voltage on the top plates of the negative differential capacitors 904 remains the same.

The control circuit 908 receives another indication of the difference between Vp and Vn (e.g., a second indication) after one of Vp and Vn has been increased by Vref/2. In some examples, the control circuit 908 is configured to provide a digital value (e.g., a dot product operation output, YOUT) responsive to at least the first indication and the second indication, which together provide information about the relationship between the initially-received voltages on the Vp_AVG interconnect and the Vn_AVG interconnect sufficient to generate a digital output value.

In some examples, the ADC 410 continues to a second phase in which the control circuit 908 provides output signals to the driver circuits 910, 912 responsive to the second indication. The output signals responsive to the second indication cause one of the drivers 914, 916 to provide the reference voltage (Vref) to one of the 8C groups, and cause the other of the drivers 914, 916 to provide the ground voltage to the other of the 8C groups. In this example, the output signals also cause the drivers 914, 916 to continue to provide the voltages to the 16C groups from the first phase.

For example, responsive to Vp being greater than Vn, the control circuit 908 output signals cause the driver 916 to provide Vref to the bottom plates of the 8C group of the negative differential capacitors 904. Also responsive to Vp being greater than Vn, the control circuit 908 output signals cause the driver 914 to continue to provide the ground voltage to the bottom plates of the 8C group of the positive differential capacitors 902. Accordingly, the voltage on the top plates of the negative differential capacitors 904 increases by Vref/4 because the 8C group is one-quarter of the total of 32 negative differential capacitors 904. The voltage on the top plates of the positive differential capacitors 902 remains the same because the bottom plate voltage of the 8C group of the positive differential capacitors 902 did not change.

For example, responsive to Vn being greater than Vp, the control circuit 908 output signals cause the driver 914 to provide Vref to the bottom plates of the 8C group of the positive differential capacitors 902. Also responsive to Vn being greater than Vp, the control circuit 908 output signals cause the driver 916 to continue to provide the ground voltage to the bottom plates of the 8C group of the negative differential capacitors 904. Accordingly, the voltage on the top plates of the positive differential capacitors 902 increases by Vref/4, while the voltage on the top plates of the negative differential capacitors 904 remains the same.

The control circuit 908 receives another indication of the difference between Vp and Vn (e.g., a third indication) after one of Vp and Vn has been increased by Vref/4. In some examples, the control circuit 908 is configured to provide the digital value responsive to at least the first indication, the second indication, and the third indication, which together provide information about the relationship between the initially-received voltages on the Vp_AVG interconnect and the Vn_AVG interconnect sufficient to generate a digital output value.

In some examples, the ADC 410 continues to one or more additional phases in which the control circuit 908 provides output signals to the driver circuits 910, 912 responsive to the third indication and so on. The output signals responsive to the third indication cause one of the drivers 914, 916 to provide the reference voltage (Vref) to one of the 4C groups, and cause the other of the drivers 914, 916 to provide the ground voltage to the other of the 4C groups. In this example, the output signals also cause the drivers 914, 916 to continue to provide the voltages to the 16C and 8C groups from the first and second phases. Responsive to subsequent indications, the control circuit 908 provides output signals to the driver circuits 910, 912 to cause the drivers 914, 916 to provide Vref or the ground voltage to the 2C group or one of the C groups in a similar manner.

For example, responsive to Vp being greater than Vn in the third indication, the control circuit 908 output signals cause the driver 916 to provide Vref to the bottom plates of the 4C group of the negative differential capacitors 904. Also responsive to Vp being greater than Vn, the control circuit 908 output signals cause the driver 914 to continue to provide the ground voltage to the bottom plates of the 4C group of the positive differential capacitors 902. Accordingly, the voltage on the top plates of the negative differential capacitors 904 increases by Vref/8 because the 4C group is one-eighth of the total of 32 negative differential capacitors 904. The voltage on the top plates of the positive differential capacitors 902 remains the same because the bottom plate voltage of the 4C group of the positive differential capacitors 902 did not change.

For example, responsive to Vn being greater than Vp, the control circuit 908 output signals cause the driver 914 to provide Vref to the bottom plates of the 4C group of the positive differential capacitors 902. Also responsive to Vn being greater than Vp, the control circuit 908 output signals cause the driver 916 to continue to provide the ground voltage to the bottom plates of the 4C group of the negative differential capacitors 904. Accordingly, the voltage on the top plates of the positive differential capacitors 902 increases by Vref/8, while the voltage on the top plates of the negative differential capacitors 904 remains the same.

The control circuit 908 receives another indication of the difference between Vp and Vn (e.g., a fourth indication) after one of Vp and Vn has been increased by Vref/8. In some examples, the control circuit 908 is configured to provide the digital value responsive to at least the first indication, the second indication, the third indication, and the fourth indication, which together provide information about the relationship between the initially-received voltages on the Vp_AVG interconnect and the Vn_AVG interconnect sufficient to generate a digital output value. As described above, in some examples the control circuit 908 is configured to continue in this manner by causing the drivers 914, 916 to provide Vref or the ground voltage to the 2C group or one of the C groups.

The ADC 410 is implemented using the same capacitors 902, 904 that were used by the MAV circuit arrays 404 to perform the multiplication and averaging operations described above. In some cases, the Vp_AVG and Vn_AVG interconnects contribute a parasitic capacitance per local column (e.g., Cpar). In the above examples, the 32 local columns contribute 32*Cpar to each of the Vp_AVG and Vn_AVG interconnects. As a result, the above voltage increments (e.g., Vref/2, Vref/4, Vref/8) are ideal values, assuming Cpar is 0. However, in certain examples, the reference voltage increments, such as Vref/2, is given by Vref*16C/(32C+32Cpar), which is less than Vref/2. In these examples, the capacitors 902, 904 are implemented to have a capacitance that is greater than Cpar (e.g., C>Cpar), which reduces the influence of the parasitic capacitance. As described above, the capacitors 902, 904 are fabricated on a metal layer that is separate from (e.g., above) a layer on which the bit cells of the sub-array are fabricated, and do not significantly add to the area of the sub-array 402 or the CIM array 204. Accordingly, the ADC 410 is configured to implement a successive-approximation analog-to-digital conversion without using additional area to implement binary-weighted reference capacitors.

Figure 10:
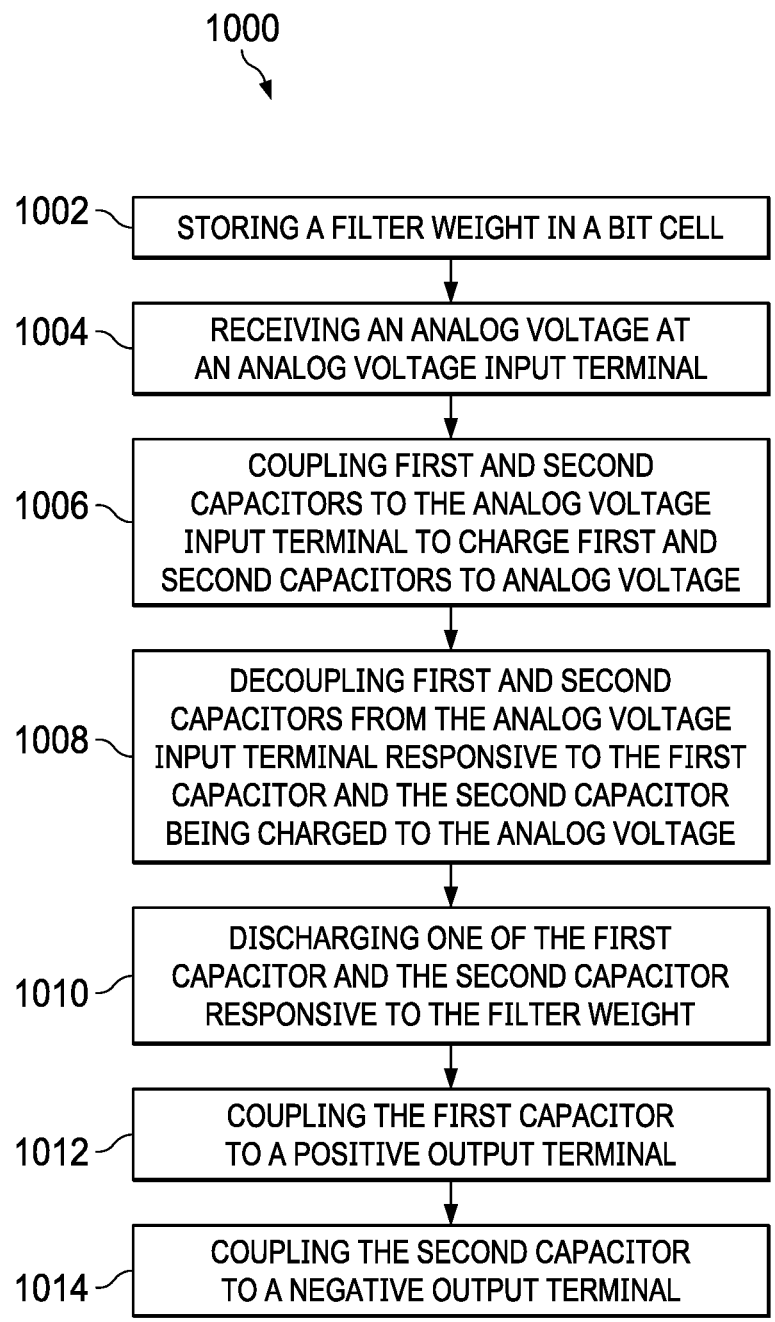
FIG. 10 is a flow diagram of a method of performing a MAV operation using a CIM array in various examples.

FIG. 10 is a flow diagram of a method 1000 of performing a MAV operation using a CIM array 204 in various examples. The method 1000 begins in block 1002 with storing a filter weight in a bit cell. As described above, a bit cell 422 (or a pair of bit cells 422) stores a binary or ternary filter weight wk.

The method 1000 continues in block 1004 with receiving an analog voltage at an analog voltage input terminal. As described above, the switching network 520 has an analog voltage input terminal 522 that is adapted to be coupled to the GXBL interconnect, which receives an analog voltage input (Va) from a DAC 406.

The method 1000 continues in block 1006 with coupling first and second capacitors to the analog voltage input terminal to charge first and second capacitors to the analog voltage. As described above, responsive to the PCH_DAC signal being logic high, the switching network 520 couples the first and second capacitors 424, 426 to the GXBL interconnect to pre-charge the first and second capacitors 424, 426 to Va.

The method 1000 continues in block 1008 with decoupling first and second capacitors from the analog voltage input terminal responsive to the first capacitor and the second capacitor being charged to the analog voltage. As described above, after the first and second capacitors 424, 426 are charged to Va, PCH_DAC transitions to logic low to isolate or decouple the first and second capacitors 424, 426 from the GXBL interconnect.

The method 1000 continues in block 1010 with discharging one of the first capacitor and the second capacitor responsive to the filter weight. As described above, responsive to CSEL transitioning to logic high, one of the bit lines LBL, LBLB coupled to a bit cell 422 is discharged responsive to a filter weight stored by the bit cell 422. The bit lines LBL, LBLB discharge one of the first capacitor 424 and the second capacitor 426.

The method 1000 continues in block 1012 with coupling the first capacitor to a positive output terminal and in block 1014 with coupling the second capacitor to a negative output terminal. As described above, responsive to the EN_AVG signal being logic high, the first capacitor 424 is coupled in parallel to first capacitors across the sub-array 402 to which the local MAV circuit 408 is coupled, and the second capacitor 426 is coupled in parallel to second capacitors across the sub-array 402 to which the local MAV circuit 408 is coupled. Accordingly, responsive to the EN_AVG signal being logic high, the Vp_AVG interconnect provides a voltage that is an average of voltages on the first capacitors 424 across the sub-array 402 and the Vn_AVG interconnect provides a voltage that is an average of voltages on the second capacitors 426 across the sub-array 402.

Figure 11:
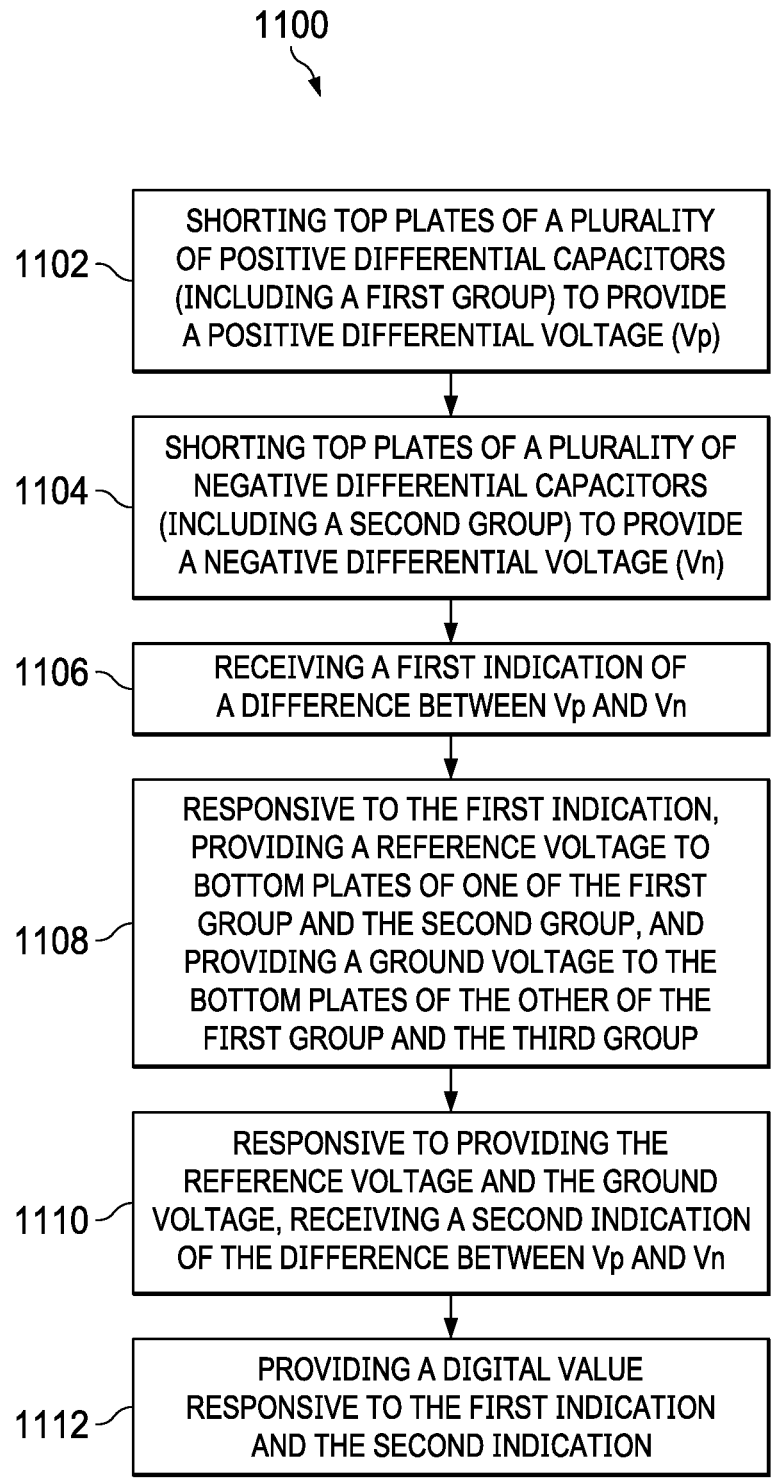
FIG. 11 is a flow diagram of a method of analog-to-digital conversion using a CIM array in various examples.

FIG. 11 is a flow diagram of a method 1100 of analog-to-digital conversion using a CIM array 204 in various examples. The method 1100 begins in block 1102 with shorting or connecting top plates of a plurality of positive differential capacitors (including a first group) to provide a positive differential voltage (Vp). The method 1100 also continues in block 1104 with shorting or connecting top plates of a plurality of negative differential capacitors (including a second group) to provide a negative differential voltage (Vn). In an example, the switches or transistors used to short or connect the top plates of the capacitors have leakage currents that are sufficiently low. For example, the leakage currents of these switches or transistors are less than an amount to discharge the capacitor voltage by one least-significant bit (LSB) of resolution of the ADC 410 for a threshold time of operation (e.g., a few to tens or hundreds of nanoseconds).

As described above, responsive to the EN_AVG signal being logic high, the Vp_AVG interconnect is coupled or shorted to the top plates of the positive differential capacitors 902, and the Vn_AVG interconnect is coupled or shorted to the top plates of the negative differential capacitors 904. The voltage on the Vp_AVG interconnect is referred to as a positive differential voltage (or Vp) and the voltage on the Vn_AVG interconnect is referred to as a negative differential voltage (or Vn). For each sub-array 402, an ADC 410 is coupled to the Vp_AVG and Vn_AVG interconnects of that sub-array. Accordingly, the ADC 410 is configured to receive the positive differential voltage and the negative differential voltage, and to provide a digital output YOUT that indicates a value of the received differential analog voltages (e.g., Vp_AVG minus Vn_AVG).

The method 1100 continues in block 1106 with receiving a first indication of a difference between Vp and Vn. As described above, the comparator 906 inputs are coupled to the Vp_AVG interconnect and to the Vn_AVG interconnect. Accordingly, the comparator 906 output provides an indication of a difference between Vp and Vn. For example, the comparator 906 output is logic high responsive to Vp being greater than Vn, and is logic low responsive to Vn being greater than Vp.

The method 1100 continues in block 1108 with, responsive to the first indication, providing a reference voltage to bottom plates of one of the first group and the second group, and providing a ground voltage to the bottom plates of the other of the first group and the second group. As described above, the control circuit 908 is configured to provide output signals to the driver circuit 910 and to the driver circuit 912 responsive to the indication received from the comparator 906. For example, the control circuit 908 receives an indication of the difference between Vp and Vn from the comparator 906 (e.g., a first indication). Responsive to the first indication, the control circuit 908 provides output signals to the driver circuits 910, 912 to cause one of the drivers 914, 916 to provide the reference voltage (Vref) to the bottom plates of one of the 16C groups and to cause the other of the drivers 914, 916 to provide the ground voltage to the bottom plates of the other of the 16C groups.

The method 1100 continues in block 1110 with, responsive to providing the reference voltage and the ground voltage, receiving a second indication of the difference between Vp and Vn. As described above, the control circuit 908 receives another indication of the difference between Vp and Vn (e.g., a second indication from the comparator 906) after one of Vp and Vn has been increased by a fraction of Vref by providing the reference voltage to the bottom plates of one of the groups of capacitors 902, 904.

The method 1100 continues in block 1112 with providing a digital value responsive to the first indication and the second indication. As described above, the control circuit 908 is configured to provide a digital value (e.g., a dot product operation output, YOUT) responsive to at least the first indication and the second indication, which together provide information about the relationship between the initially-received voltages on the Vp_AVG interconnect and the Vn_AVG interconnect sufficient to generate a digital output value.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While particular transistor structures are referred to above, other transistors or device structures may be used instead. For example, p-type MOSFETs may be used in place of n-type MOSFETs with little or no additional changes. In addition, other types of transistors (such as bipolar transistors) may be utilized in place of the transistors shown. The capacitors may be implemented using different device structures (such as metal structures formed over each other to form a parallel plate capacitor) or may be formed on layers (metal or doped semiconductors) closer to or farther from the semiconductor substrate surface.

As used above, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described examples, and other examples are possible, within the scope of the claims.

What is claimed is:

1. A device, comprising:
a comparator having a comparator output and first and second comparator inputs;
a first capacitor having a first top plate and a first bottom plate;
a second capacitor having a second top plate and a second bottom plate;
a set of switches configured to:
in a first mode;
connect the first top plate to a first signal input, and disconnect the first top plate from the first comparator input; and
connect the second top plate to a second signal input, and disconnect the second top plate from the second comparator input; and
in a second mode;
disconnect the first top plate from the first signal input, and connect the first top plate to the first comparator input; and
disconnect the second top plate from the second signal input, and connect the second top plate to the second comparator input;
a first driver circuit having a first driver input and a first driver output, the first driver output coupled to the first bottom plate, and the first driver circuit configured to provide one of first or second voltages at the first driver output responsive to a state of the first driver input;
a second driver circuit having a second driver input and a second driver output, the second driver output coupled to the second bottom plate, and the second driver circuit configured to provide one of the first or second voltages at the second driver output responsive to a state of the second driver input; and
a control circuit having a control input, a digital output, and first and second control outputs, the control input coupled to the comparator output, the first control output coupled to the first driver input, the second control output coupled to the second driver input, and the control circuit configured to, in the second mode:
set the first and second control outputs to a first state, in which the first driver circuit is configured to set the first bottom plate to the first voltage responsive to the first control output having the first state, and the second driver circuit is configured to set the second bottom plate to the first voltage responsive to the second control output having the first state;
after setting the first and second control outputs to the first state, receive a first comparison result at the control input;
responsive to the first comparison result, set the first control output to a second state, in which the first driver circuit is configured to set the first bottom plate to the second voltage responsive to the first control output having the second state;
after setting the first control output to the second state, receive a second comparison result at the control input; and
provide a digital value responsive to the first and second comparison results.

2. The device of claim 1, further comprising:
a third capacitor having a third top plate and a third bottom plate;
a fourth capacitor having a fourth top plate and a fourth bottom plate,
wherein the set of switches is configured to:
in the first mode:
connect the third top plate to a third signal input, and disconnect the third top plate from the first comparator input; and
connect the fourth top plate to a fourth signal input, and disconnect the fourth top plate from the second comparator input; and
in the second mode:
disconnect the third top plate from the third signal input, and connect the third top plate to the first comparator input; and
disconnect the fourth top plate from the fourth signal input, and connect the fourth top plate to the second comparator input.

3. The device of claim 2, further comprising:
a third driver circuit having a third driver input and a third driver output, the third driver output coupled to the third bottom plate, and the third driver circuit configured to provide one of the first or second voltages at the third driver output responsive to a state of the third driver input; and
a fourth driver circuit having a fourth driver input and a fourth driver output, the fourth driver output coupled to the fourth bottom plate, and the fourth driver circuit configured to provide one of the first or second voltages at the fourth driver output responsive to a state of the fourth driver input,
wherein the control circuit has third and fourth control outputs, the third control output coupled to the third driver input, the fourth control output coupled to the fourth driver input, and the control circuit is configured to, in the second mode:
set the third and fourth control outputs to the first state, in which the third driver circuit is configured to set the third bottom plate to the first voltage responsive to the third control output having the first state, and the fourth driver circuit is configured to set the fourth bottom plate to the first voltage responsive to the fourth control output having the first state;
responsive to the second comparison result, set the third control output to the second state, in which the third driver circuit is configured to set the third bottom plate to the second voltage responsive to the third control output having the second state;
after setting the third control output to the second state, receive a third comparison result at the control input; and
provide the digital value responsive to the first, second and third comparison results.

4. The device of claim 3, further comprising:
a fifth capacitor having a fifth top plate and a fifth bottom plate;
a sixth capacitor having a sixth top plate and a sixth bottom plate,
wherein the set of switches is configured to:
in the first mode:
connect the fifth top plate to a fifth signal input, and disconnect the fifth top plate from the first comparator input; and
connect the sixth top plate to a sixth signal input, and disconnect the sixth top plate from the second comparator input; and
in the second mode:
disconnect the fifth top plate from the fifth signal input, and connect the fifth top plate to the first comparator input; and
disconnect the sixth top plate from the sixth signal input, and connect the sixth top plate to the second comparator input.

5. The device of claim 4, further comprising:
a fifth driver circuit having a fifth driver input and a fifth driver output, the fifth driver output coupled to the fifth bottom plate, and the fifth driver circuit configured to provide one of the first or second voltages at the fifth driver output responsive to a state of the fifth driver input; and
a sixth driver circuit having a sixth driver input and a sixth driver output, the sixth driver output coupled to the sixth bottom plate, and the sixth driver circuit configured to provide one of the first or second voltages at the sixth driver output responsive to a state of the sixth driver input,
wherein the control circuit has fifth and sixth control outputs, the fifth control output coupled to the fifth driver input, the sixth control output coupled to the sixth driver input, and the control circuit is configured to, in the second mode:
set the fifth and sixth control outputs to the first state, in which the fifth driver circuit is configured to set the fifth bottom plate to the first voltage responsive to the fifth control output having the first state, and the sixth driver circuit is configured to set the sixth bottom plate to the first voltage responsive to the sixth control output having the first state;
responsive to the third comparison result, set the fifth control output to the second state, in which the fifth driver circuit is configured to set the fifth bottom plate to the second voltage responsive to the fifth control output having the second state;
after setting the fifth control output to the second state, receive a fourth comparison result at the control input; and
provide the digital value responsive to the first, second, third, and fourth comparison results.

6. The device of claim 3, further comprising:
a first set of capacitors including the first capacitor, each of the first set of capacitors having respective first top and bottom plates, the first bottom plates of the first set of capacitors coupled to the first driver output;
a second set of capacitors including the second capacitor, each of the second set of capacitors having respective second top and bottom plates, the second bottom plates of the second set of capacitors coupled to the second driver output;
a third set of capacitors including the third capacitor, each of the third set of capacitors having respective third top and bottom plates, the third bottom plates of the third set of capacitors are coupled to the third driver output; and
a fourth set of capacitors including the fourth capacitor, each of the fourth set of capacitors having respective fourth top and bottom plates, the fourth bottom plates of the fourth set of capacitors coupled to the fourth driver output,
wherein the set of switches is configured to:
in the first mode:
connect the first and third top plates of the respective first and third sets of capacitors to the first signal input, and disconnect the first and third top plates from the first comparator input; and
connect the second and fourth top plates of the respective second and fourth sets of capacitors to the second signal input, and disconnect the second and fourth top plates from the second comparator input; and
in the second mode:
disconnect the first and third top plates from the first signal input, and connect the first and third top plates to the first comparator input; and
disconnect the second and fourth top plates from the second signal input, and connect the second and fourth top plates to the second comparator input.

7. The device of claim 6, wherein:
each of the first and second sets of capacitors includes a respective first number of the capacitors; and
each of the third and fourth sets of capacitors includes a respective second number of the capacitors, the second number being half of the first number.

8. The device of claim 2, further comprising:
a first bit cell having a first bit cell output coupled to the first signal input;
a second bit cell having a second bit cell output coupled to the second signal input;
a third bit cell having a third bit cell output coupled to the third signal input; and
a fourth bit cell having a fourth bit cell output coupled to the fourth signal input.

9. The device of claim 8, wherein the first and second capacitors are in a metal layer above the first through fourth bit cells.

10. The device of claim 1, further comprising:
a first bit cell having a first bit cell output, the first bit cell configured to store a first bit value and provide a first signal at the first bit cell output responsive to the first bit value;
a second bit cell having a second bit cell output, the second bit cell configured to store a second bit value and provide a second signal at the second bit cell output responsive to the second bit value,
wherein the set of switches is configured to:
in the first mode:
connect the first top plate to the first bit cell output via the first signal input; and
connect the second top plate to the second bit cell output via the second signal input; and
in a third mode:
connect the first top plate to a third signal input;
connect the second top plate to a fourth signal input;
disconnect the first top plate from the first comparator input and from the first signal input; and
disconnect the second top plate from the second comparator input and from the second signal input.

11. The device of claim 10, wherein the digital value is first digital value;
  wherein the device further comprises a digital-to-analog converter (DAC) having a digital input and an analog output, the analog output coupled to the third and fourth signal inputs, and the DAC configured to provide a third voltage at the analog output responsive to a second digital value at the digital input;
  wherein the first capacitor is configured to:
    in the third mode, store a first charge responsive to the third voltage at the first top plate; and
    in the first mode, remove at least some of the first charge responsive to the first signal at the first signal input;
  wherein the second capacitor is configured to:
    in the third mode, store a second charge responsive to the third voltage at the second top plate; and
    in the first mode, maintain the second charge responsive to the second signal at the second signal input; and
  wherein the control circuit is configured to, in the second mode, provide the first digital value representing a voltage difference between the first top plate and the second top plate, the voltage difference representing a product between the second digital value and one of the first or second bit values.

12. The device of claim 10, wherein the digital value is first digital value;
  wherein the device further comprises:
    a first digital-to-analog converter (DAC) having a first digital input and a first analog output, the first analog output coupled to the third signal input, and the first DAC configured to provide a third voltage at the first analog output responsive to a second digital value at the first digital input; and
    a second DAC having a second digital input and a second analog output, the second analog output coupled to the fourth signal input, and the second DAC configured to provide a fourth voltage at the second analog output responsive to a third digital value at the second digital input;
  wherein the first capacitor is configured to:
    in the third mode, store a first charge responsive to the third voltage at the first top plate; and
    in the first mode, remove at least some of the first charge responsive to the first signal at the first signal input;
  wherein the second capacitor is configured to:
    in the third mode, store a second charge responsive to the fourth voltage at the second top plate; and
    in the first mode, maintain the second charge responsive to the second signal at the second signal input; and
  wherein the control circuit is configured to, in the second mode, provide the first digital value representing a voltage difference between the first top plate and the second top plate, the voltage difference representing a product between one of the second or third digital values and one of the first or second bit values.

13. A method, comprising:
  in a first mode:
    connecting a first top plate of a first capacitor to a first signal input, and disconnecting the first top plate from a first comparator input of a comparator;
    connecting a second top plate of a second capacitor to a second signal input, and disconnecting the second top plate from a second comparator input of the comparator;
  in a second mode:
    disconnecting the first top plate from the first signal input, and connecting the first top plate to the first comparator input;
    disconnecting the second top plate from the second signal input, and connecting the second top plate to the second comparator input;
    setting a first bottom plate of the first capacitor and a second bottom plate of the second capacitor to a first voltage;
    receiving a first comparison result between voltages at the first and second top plates after setting the first and second bottom plates to the first voltage;
    responsive to the first comparison result, setting the first bottom plate to a second voltage;
    after setting the first bottom plate to the second voltage, receiving a second comparison result between voltages at the first and second top plates; and
    providing a digital value responsive to the first and second comparison results.

14. The method of claim 13, further comprising:
  in the first mode:
    connecting a third top plate of a third capacitor to a third signal input, and disconnecting the third top plate from the first comparator input; and
    connecting a fourth top plate of a fourth capacitor to a fourth signal input, and disconnecting the fourth top plate from the second comparator input; and
  in the second mode:
    disconnecting the third top plate from the third signal input, and connecting the third top plate to the first comparator input; and
    disconnecting the fourth top plate from the fourth signal input, and connecting the fourth top plate to the second comparator input.

15. The method of claim 14, further comprising, in the second mode:
  setting a third bottom plate of the third capacitor and a fourth bottom plate of the fourth capacitor to the first voltage;
  responsive to the second comparison result, setting the third bottom plate to the second voltage;
  after setting the third bottom plate to the second voltage, receiving a third comparison result between voltages at the third and fourth top plates; and
  providing the digital value responsive to the first, second, and third comparison results.

16. The method of claim 15, further comprising:
  in the first mode:
    connecting a fifth top plate of a fifth capacitor to a fifth signal input, and disconnecting the fifth top plate from the first comparator input; and
    connecting a sixth top plate of a sixth capacitor to a sixth signal input, and disconnecting the sixth top plate from the second comparator input; and
  in the second mode:
    disconnecting the fifth top plate from the fifth signal input, and connecting the fifth top plate to the first comparator input; and
    disconnecting the sixth top plate from the sixth signal input, and connecting the sixth top plate to the second comparator input.

17. The method of claim 16, further comprising, in the second mode:
- setting a fifth bottom plate of the third capacitor and a sixth bottom plate of the sixth capacitor to the first voltage;
- responsive to the third comparison result, setting the fifth bottom plate to the second voltage;
- after setting the fifth bottom plate to the second voltage, receiving a fourth comparison result between the voltages of the fifth and sixth top plates; and
- providing the digital value responsive to the first, second, third, and fourth comparison results.

18. The method of claim 14, wherein:
- the first capacitor is part of a first set of capacitors each having respective first top and bottom plates;
- the second capacitor is part of a second set of capacitors each having respective second top and bottom plates;
- the third capacitor is part of a third set of capacitors each having respective third top and bottom plates;
- the fourth capacitor is part of a fourth set of capacitors each having respective fourth top and bottom plates; and
- the method further comprises:
  - in the first mode:
    - connecting the first and third top plates to the first signal input, and disconnecting the first and third top plates from the first comparator input; and
    - connecting the second and fourth top plates to the second signal input, and disconnecting the second and fourth top plates from the second comparator input; and
  - in the second mode:
    - disconnecting the first and third top plates from the first signal input, and connecting the first and third top plates to the first comparator input; and
    - disconnecting the second and fourth top plates from the second signal input, and connecting the second and fourth top plates to the second comparator input.

19. The method of claim 18, wherein:
- each of the first and second sets of capacitors includes a respective first number of the capacitors; and
- each of the third and fourth sets of capacitors includes a respective second number of the capacitors, the second number being half of the first number.

20. The method of claim 14, wherein, in the first mode:
- connecting the first top plate to the first signal input includes connecting the first top plate to a first bit cell output of a first bit cell via the first signal input;
- connecting the second top plate to the second signal input includes connecting the second top plate to a second bit cell output of a second bit cell via the second signal input;
- connecting the third top plate to the third signal input includes connecting the third top plate to a third bit cell output of a third bit cell via the third signal input; and
- connecting the fourth top plate to the fourth signal input includes connecting the fourth top plate to a fourth bit cell output of a fourth bit cell via the fourth signal input.

21. The method of claim 20, wherein the first, second, third, and fourth bit cells are part of a compute-in-memory (CIM) array.

22. A device, comprising:
- a first bit cell having a first bit cell output, the first bit cell configured to store a first bit value;
- a second bit cell having a second bit cell output, the second bit cell configured to store a second bit value;
- a first capacitor having a first top plate and a first bottom plate;
- a second capacitor having a second top plate and a second bottom plate;
- a comparator having a comparator output and first and second comparator inputs;
- a set of switches configured to:
  - in a first mode:
    - connect the first top plate to a first signal input, and disconnect the first top plate from the first bit cell output and from the first comparator input; and
    - connect the second top plate to a second signal input, and disconnect the second top plate from the second bit cell output and from the second comparator input;
  - in a second mode:
    - connect the first top plate to the first bit cell output, and disconnect the first top plate from the first signal input and from the first comparator input; and
    - connect the second top plate to the second bit cell output, and disconnect the second top plate from the second signal input and from the second comparator input; and
  - in a third mode:
    - connect the first top plate to the first comparator input, and disconnect the first top plate from the first bit cell output and from the first signal input; and
    - connect the second top plate to the second comparator input, and disconnect the second top plate from the second bit cell output and from the second signal input;
and
- a control circuit having a control input and a digital output, the control input coupled to the comparator output, and the control circuit configured to, in the third mode, provide a digital value at the digital output responsive to a state of the control input.

23. The device of claim 22, further comprising:
- a first driver circuit having a first driver input and a first driver output, the first driver output coupled to the first bottom plate, and the first driver circuit configured to provide one of first or second voltages at the first driver output responsive to a state of the first driver input;
- a second driver circuit having a second driver input and a second driver output, the second driver output coupled to the second bottom plate, and the second driver circuit configured to provide one of the first or second voltages at the second driver output responsive to a state of the second driver input,
- wherein the control circuit has a first control output and a second control output, the first control output coupled to the first driver input, the second control output coupled to the second driver input, and the control circuit configured to, in the second mode:
  - set the first and second control outputs to a first state, in which the first driver circuit is configured to set the first bottom plate to the first voltage responsive to the first control output having the first state, and the second driver circuit is configured to set the second bottom plate to the first voltage responsive to the second control output having the first state;
  - after setting the first and second control outputs to the first state, receive a first comparison result at the control input;

responsive to the first comparison result, set the first control output to a second state, in which the first driver circuit is configured to set the first bottom plate to the second voltage responsive to the first control output having the second state;

after setting the first control output having the second state, receive a second comparison result at the control input; and provide the digital value responsive to the first and second comparison results.

24. The device of claim 22, wherein the digital value is a first digital value;

wherein the device further includes a DAC having a digital input and an analog output, the analog output coupled to the first and second signal inputs, and the DAC configured to provide a third voltage at the analog output responsive to a second digital value at the digital input; and wherein the control circuit is configured to, in the third mode, provide the first digital value representing a voltage difference between the first top plate and the second top plate, the voltage difference representing a product between the second digital value and one of the first or second bit values.

* * * * *